US012538650B2

(12) United States Patent
Xiao et al.

(10) Patent No.: US 12,538,650 B2
(45) Date of Patent: Jan. 27, 2026

(54) DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Xingliang Xiao, Beijing (CN); Yao Huang, Beijing (CN); Chao Zeng, Beijing (CN); Xing Ren, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 664 days.

(21) Appl. No.: 17/914,582

(22) PCT Filed: Nov. 12, 2021

(86) PCT No.: PCT/CN2021/130195
§ 371 (c)(1),
(2) Date: Sep. 26, 2022

(87) PCT Pub. No.: WO2023/070478
PCT Pub. Date: May 4, 2023

(65) Prior Publication Data
US 2024/0389384 A1   Nov. 21, 2024

(30) Foreign Application Priority Data
May 31, 2021   (CN) .......................... 202110598184.6

(51) Int. Cl.
*H10K 59/121*   (2023.01)
*H10K 59/35*   (2023.01)
(Continued)

(52) U.S. Cl.
CPC ....... *H10K 59/121* (2023.02); *H10K 59/1213* (2023.02); *H10K 59/352* (2023.02);
(Continued)

(58) Field of Classification Search
CPC ............. H10K 59/121; H10K 59/1213; H10K 59/352; H10K 59/353; H10K 59/65;
(Continued)

(56) References Cited

U.S. PATENT DOCUMENTS 10,950,666 B2   3/2021   Zhou et al.
11,462,590 B2   10/2022  Fan et al.
(Continued)

FOREIGN PATENT DOCUMENTS

CN   103904105 A   7/2014
CN   106654025 A   5/2017
(Continued)

OTHER PUBLICATIONS

Extended European Search Report dated Mar. 15, 2024 received in European Patent Application No. EP 21943854.6.
(Continued)

*Primary Examiner* — Pegeman Karimi
(74) *Attorney, Agent, or Firm* — Scully, Scott, Murphy & Presser, P.C.

(57) ABSTRACT

A display substrate and a display device are provided. The display substrate includes a first display region and a second display region. The first display region includes first light emitting unit groups and first pixel circuit groups connected to the first light emitting unit groups, the second display region includes second light emitting unit groups and second pixel circuit groups connected to the second light emitting unit groups, and each light emitting unit group includes light emitting units of different colors. In the first display region, one row of light emitting units include light emitting units of
(Continued)

N different colors; in the second display region, one row of light emitting units include light emitting units of M different colors, where N is greater than M, and both N and M are positive integers not less than 1.

20 Claims, 8 Drawing Sheets

(51) Int. Cl.
  *H10K 59/65* (2023.01)
  *H10K 59/88* (2023.01)
(52) U.S. Cl.
  CPC ........... *H10K 59/353* (2023.02); *H10K 59/65* (2023.02); *H10K 59/88* (2023.02)
(58) Field of Classification Search
  CPC .. H10K 59/88; G09G 3/32; G09G 2310/0286; G09G 2310/08; G09G 2320/0233; G09G 3/20; G09G 3/3266; G11C 19/287; G11C 19/28
  See application file for complete search history.

(56) References Cited

U.S. PATENT DOCUMENTS

| | | | |
|---|---|---|---|
| 2016/0225834 A1 | 8/2016 | Kim et al. | |
| 2019/0206310 A1* | 7/2019 | Tian | H10K 59/353 |
| 2021/0020664 A1 | 1/2021 | Tan | |
| 2021/0065625 A1* | 3/2021 | Wang | H10K 59/35 |
| 2021/0264859 A1 | 8/2021 | Liu et al. | |
| 2022/0069023 A1 | 3/2022 | Lou et al. | |
| 2022/0123094 A1 | 4/2022 | Qiu et al. | |
| 2022/0336573 A1* | 10/2022 | Chen | H10K 50/822 |
| 2023/0082133 A1* | 3/2023 | Sun | G09G 3/30 257/89 |

FOREIGN PATENT DOCUMENTS

| | | |
|---|---|---|
| CN | 108269840 A | 7/2018 |
| CN | 109427851 A | 3/2019 |
| CN | 109634011 A | 4/2019 |
| CN | 109872670 A | 6/2019 |
| CN | 110783384 A | 2/2020 |
| CN | 111326560 A | 6/2020 |
| CN | 111477103 A | 7/2020 |
| CN | 111584591 A | 8/2020 |
| CN | 112489584 A | 3/2021 |
| CN | 215451420 U | 1/2022 |
| WO | 2020034077 A1 | 2/2020 |

OTHER PUBLICATIONS

First Office Action dated Nov. 18, 2024 for Chinese Patent Application No. 202110598184.6.

* cited by examiner

DISPLAY SUBSTRATE AND DISPLAY DEVICE

CROSS-REFERENCE TO RELATED APPLICATIONS

This application is a U.S. national phase entry of PCT International Application No. PCT/CN2021/130195, filed on Nov. 12, 2021, which claims priority to Chinese Patent Application No. 202110598184.6, filed on May 31, 2021. The entire disclosure of PCT International Application No. PCT/CN2021/130195 and the entire disclosure of Chinese Patent Application No. 202110598184.6 are incorporated herein by reference in their entirety as part of the subject application.

TECHNICAL FIELD

At least one embodiment of the present disclosure relates to a display substrate and a display device.

BACKGROUND

With people's continuous pursuit of visual effects of display products, narrow frame and even full-screen display have become a new trend in the development of organic light emitting diode (OLED) display products. With the gradual and stable increase of the screen-to-body ratio of many mobile phones, full screen has become the current trend. The front camera is the key to design a full screen. In order to achieve a higher screen-to-body ratio, display products with screens, such as notch screen, water drop screen and hole digging screen, have emerged one after another. These full screen forms have increased the screen-to-body ratio by sacrificing the appearance of mobile phones. Therefore, in recent years, under the trend of full screen, the flexible screen with integrated under-screen camera solves the pain point of traditional full screen display, and the higher screen-to-body ratio brings a new visual experience to users.

SUMMARY

At least one embodiment of the present disclosure provides a display substrate and a display device.

At least one embodiment of the present disclosure provides a display substrate, which includes a first display region and a second display region. At least part of the first display region is located on a side of the second display region in a first direction, the first display region includes a plurality of first light emitting unit groups and a plurality of first pixel circuit groups connected to the plurality of first light emitting unit groups, the second display region includes a plurality of second light emitting unit groups and a plurality of second pixel circuit groups connected to the plurality of second light emitting unit groups, each light emitting unit group includes a plurality of light emitting units of different colors. In the first display region, one row of light emitting units arranged along a second direction intersected with the first direction include light emitting units of N different colors: in the second display region, one row of light emitting units arranged along the second direction include light emitting units of M different colors, where N is greater than M, and both N and M are positive integers not less than 1.

For example, in the first display region, one row of light emitting units arranged along the second direction include light emitting units of three different colors: in the second display region, one row of light emitting units arranged along the second direction include light emitting units of one color or light emitting units of two different colors, and the light emitting units of the two different colors are alternately arranged along the second direction.

For example, in the first display region, one row of light emitting units arranged along the second direction include first color light emitting units, second color light emitting units and third color light emitting units which are repeatedly arranged in sequence; in the second display region, one row of light emitting units arranged along the second direction include one row of third color light emitting units, one row of second color light emitting units, or one row of first color light emitting units and second color light emitting units alternately arranged.

For example, the display substrate further includes: a third display region, the first display region is located on at least one side of the third display region, and at least part of the second display region is located between the first display region and the third display region. The third display region includes a plurality of third light emitting unit groups, and a plurality of third pixel circuit groups connected to the plurality of third light emitting unit groups are located at an outer side of the third display region.

For example, the plurality of first pixel circuit groups include a plurality of first pixel circuits, the plurality of second pixel circuit groups include a plurality of second pixel circuits, a density of the plurality of first pixel circuits is a first density, a density of the plurality of second pixel circuits is a second density, and the first density is not less than the second density.

For example, a density of the plurality of first light emitting unit groups in the first display region is a third density, a density of the plurality of second light emitting unit groups in the second display region is a fourth density, and the third density is greater than the fourth density: a density of the plurality of third light emitting unit groups in the third display region is a fifth density, and both the third density and the fourth density are greater than the fifth density.

For example, each of the first light emitting unit groups, each of the second light emitting unit groups and each of the third light emitting unit groups includes one first color light emitting unit, one second color light emitting unit pair and one third color light emitting unit; the first light emitting unit and the third color light emitting unit are located in different rows, and at least one second color light emitting unit of the second color light emitting unit pair and the first color light emitting unit are arranged along the second direction.

For example, in at least one of the second light emitting unit groups adjacent to one first light emitting unit group, a distance between two light emitting regions of the second color light emitting unit pair in the first direction is a first distance; a distance between a light emitting region of one second color light emitting unit, which is located in the second color light emitting unit pair of the at least one of the second light emitting unit groups and close to the one first light emitting unit group, and a light emitting region, adjacent to the light emitting region of the one second color light emitting unit, of the second color light emitting unit located in the one first light emitting unit group in the first direction is a second distance; and the first distance is greater than the second distance.

For example, the first distance is greater than a size of a light emitting region of the third color light emitting unit in the second light emitting unit group in the first direction.

For example, in the at least one of the second light emitting unit groups, one second color light emitting unit of the second color light emitting unit pair is located in the same row as the first color light emitting unit, and the other second color light emitting unit of the second color light emitting unit pair is located in the same row as the first color light emitting unit in the first light emitting unit group.

For example, a ratio of an area of a light emitting region of each first color light emitting unit in the third light emitting unit group to an area of a light emitting region of each first color light emitting unit in the first light emitting unit group is in a range of 1.1-2.5; a ratio of an area of light emitting regions of each second color light emitting unit pair in the third light emitting unit group to an area of light emitting regions of each second color light emitting unit pair in the first light emitting unit group is in a range of 1.1-2.5; and a ratio of an area of a light emitting region of each third color light emitting unit in the third light emitting unit group to an area of a light emitting region of each third color light emitting unit in the first light emitting unit group is in a range of 1.1-2.5.

For example, the plurality of second light emitting unit groups include first sub-light emitting unit groups and second sub-light emitting unit groups alternately arranged along the second direction, and at least one third light emitting unit group adjacent to the plurality of second light emitting unit groups is located in the same column as the second sub-light emitting unit groups: in at least one of the plurality of first light emitting unit groups, a distance between the light emitting region of the first color light emitting unit and the light emitting region of the second color light emitting unit adjacent to each other is a third distance: in at least one of the first sub-light emitting unit groups, a distance between the light emitting region of the first color light emitting unit and the light emitting region of the second color light emitting unit adjacent to each other is a fourth distance; in at least one of the second sub-light emitting unit groups, a distance between the light emitting region of the first color light emitting unit and the light emitting region of the second color light emitting unit adjacent to each other is a fifth distance, the fifth distance is greater than the fourth distance, and the fourth distance is greater than the third distance.

For example, in at least one of the first sub-light emitting unit groups, a distance between two center lines, extending in the first direction, of two light emitting regions of the second color light emitting unit pair is a sixth distance: in at least one of the second sub-light emitting unit groups, a distance between two center lines, extending in the first direction, of two light emitting regions of the second color light emitting unit pair is a seventh distance, and the seventh distance is greater than the sixth distance.

For example, in at least one of the first sub-light emitting unit groups, a distance between a center line extending in the first direction of the light emitting region of the first color light emitting unit and a center line extending in the first direction of the light emitting region of the second color light emitting unit located in a different row from the first color light emitting unit is an eighth distance: in at least one of the second sub-light emitting unit groups, a distance between a center line extending in the first direction of the light emitting region of the first color light emitting unit and a center line extending in the first direction of the light emitting region of the second color light emitting unit located in a different row from the first color light emitting unit is a ninth distance, and a ratio of the ninth distance to the eighth distance is in a range of 0.8-1.2.

For example, in at least one of the plurality of first light emitting unit groups and at least one of the plurality of second light emitting unit groups, the light emitting regions of the first color light emitting units have approximately the same shape and the same area: in the first light emitting unit group and the second light emitting unit group, the light emitting regions of the third color light emitting units have approximately the same shape and the same area.

For example, in at least one of the plurality of first light emitting unit groups, shapes of the light emitting regions of the first color light emitting unit and the third color light emitting unit include hexagons, and a shape of a light emitting region of each second color light emitting unit in the second color light emitting unit pair includes a pentagon.

For example, in at least one of the plurality of first light emitting unit groups and at least one of the plurality of third light emitting unit groups, shapes of light emitting regions of light emitting units emitting light of a same color are different: in at least one of the plurality of third light emitting unit groups, a shape of a light emitting region of at least one light emitting unit includes a circle, an ellipse or a droplet-shape.

For example, a ratio of an area of a light emitting region of each first color light emitting unit in the third light emitting unit group to an area of a light emitting region of each first color light emitting unit in the first light emitting unit group is in a range of 0.5-1, a ratio of an area of light emitting regions of each second color light emitting unit pair in the third light emitting unit group to an area of light emitting regions of each second color light emitting unit pair in the first light emitting unit group is in a range of 0.5-1, and a ratio of an area of a light emitting region of each third color light emitting unit in the third light emitting unit group to an area of a light emitting region of each third color light emitting unit in the first light emitting unit group is in a range of 0.5-1.

For example, in at least one of the plurality of second light emitting unit groups and at least one of the plurality of third light emitting unit groups, light emitting regions of light emitting units emitting light of a same color have approximately the same shape and the same area: in at least one of the plurality of first light emitting unit groups and at least one of the plurality of third light emitting unit groups, shapes of light emitting regions of light emitting units emitting light of a same color are different.

For example, in at least one of the plurality of second pixel circuit groups, the second pixel circuit includes two sub-pixel circuits, and the two sub-pixel circuits are configured to be connected to a same light emitting unit: in the first pixel circuit group, the first pixel circuit includes one sub-pixel circuit, and different sub-pixel circuits are configured to be connected to different light emitting units.

For example, the display substrate further includes: a plurality of data lines, extending in the first direction. The plurality of data lines include a first sub-data line and a second sub-data line: the first display region includes a first pixel circuit column, the second display region includes a second pixel circuit column, and the first pixel circuit column and the second pixel circuit column are located in different columns: the first sub-data line is connected to the first pixel circuit column, the second sub-data line is connected to the second pixel circuit column, the first sub-data line and the second sub-data line are connected by a data line connecting portion, an extending direction of the data line connecting portion is intersected with the first direction, and the data line connecting portion and the data line are located in different layers.

For example, the first display region further includes a third pixel circuit column, the second display region further includes a fourth pixel circuit column, and the third pixel circuit column and at least part of the fourth pixel circuit column are located in a same column: the plurality of data lines further include a third sub-data line and a fourth sub-data line, the third sub-data line is connected to the third pixel circuit column, the fourth sub-data line is connected to the fourth pixel circuit column, and one third sub-data line and one fourth sub-data line are one continuous data line extending in the first direction.

For example, the display substrate further includes: a plurality of power signal lines, extending in the first direction. The plurality of power signal lines include a plurality of first sub-power signal lines and a plurality of second sub-power signal lines, the plurality of first sub-power signal lines are connected to the plurality of first pixel circuit groups, the plurality of second sub-power signal lines are connected to the plurality of second pixel circuit groups, the first sub-power signal line is configured to transmit a first power signal, and the second sub-power signal line is configured to transmit a second power signal.

For example, the plurality of second sub-power signal lines include a second sub-power signal line located on the same straight line as at least one of the plurality of first sub-power signal lines, and a gap is provided between the first sub-power signal line and the second sub-power signal line which are located on the same straight line.

For example, the display substrate further includes: a base substrate: a light shielding layer, located on the base substrate and at an edge of the third display region, an orthographic projection of the light shielding layer on the base substrate overlaps with orthographic projections of the second sub-data line and the fourth sub-data line on the base substrate. The light shielding layer is located at a side, away from a film layer where the plurality of power signal lines are located, of a film layer where the data line connecting portion is located, and at least one of the plurality of second sub-power signal lines is connected to the light shielding layer.

For example, among the plurality of first pixel circuit groups, the plurality of second pixel circuit groups and the plurality of third pixel circuit groups, each pixel circuit group includes a plurality of thin film transistors, the display substrate includes a base substrate and an active semiconductor layer disposed on the base substrate, the active semiconductor layer includes an active layer pattern and a doped region pattern of each thin film transistor, and the active semiconductor layer further includes a dummy pattern: the display substrate further includes an insulating layer located at a side of the active semiconductor layer away from the base substrate, and a source-drain metal layer located at a side of the insulating layer away from the active semiconductor layer, the insulating layer includes a first via hole and a second via hole, the source-drain metal layer is connected to the doped region pattern through the first via hole, and the second via hole is configured to expose the dummy pattern.

At least one embodiment of the present disclosure provides a display device, including the display substrate as mentioned above.

BRIEF DESCRIPTION OF THE DRAWINGS

In order to clearly illustrate the technical solutions of the embodiments of the disclosure, the drawings of the embodiments will be briefly described in the following: it is obvious that the described drawings are only related to some embodiments of the disclosure and thus are not limitative to the disclosure.

DETAILED DESCRIPTION

Figure 1:
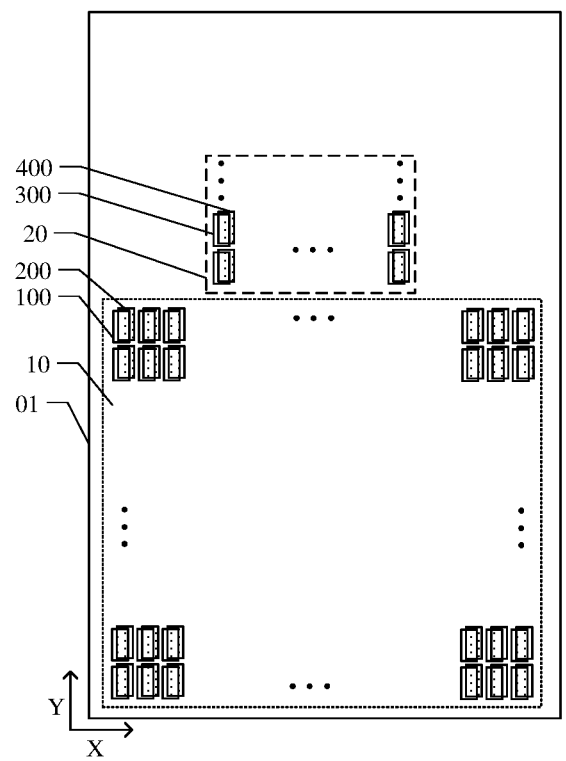
FIG. 1 is a partial planar structural view of a display substrate provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects.

Under-screen camera means that the front camera is located under the screen but does not affect display function of the screen: when the front camera is not used, the screen above the camera can still display images normally. From the appearance, the under-screen camera will not introduce any camera hole, which really achieves the full-screen display effect.

In research, the inventor(s) of the present application have noticed that: at present, there is a low-density display region (L region) and a high-density display region (H area) in the OLED display device designed by the under-screen camera, and the display brightness and current of the L region are at least half lower than those of the H region, which may affect the display effect. For example, the luminous density of pixels in L region is $1/8 \sim 1/2$ of the luminous density of pixels in the H region, and the boundary between the L region and the H region is dark. The L region is a transparent display region, and the H region is an opaque display region only used for display. The L region includes light emitting units, and the pixel circuits driving the light emitting units are in a region at an outer side of the L region, so as to improve the light transmittance of the region L. That is, the light emitting units and the pixel circuits are separately arranged to improve the light transmittance of the region L. For example, the L region can be a hole region in which no pixel circuit is provided in terms of the entire display region.

The embodiments of the present disclosure provide a display substrate and a display device. The display substrate includes a first display region and a second display region. At least part of the first display region is located on a side of the second display region in a first direction. The first display region includes a plurality of first light emitting unit groups and a plurality of first pixel circuit groups connected to the plurality of first light emitting unit groups, the second display region includes a plurality of second light emitting unit groups and a plurality of second pixel circuit groups connected to the plurality of second light emitting unit groups, and each light emitting unit group includes a plurality of light emitting units of different colors. In the first display region, one row of light emitting units arranged along a second direction intersected with the first direction include light emitting units of N different colors; in the second display region, one row of light emitting units arranged along the second direction include light emitting units of M different colors, where N is greater than M, and both N and M are positive integers not less than 1. In the embodiments of the present disclosure, by setting the number of different color light emitting units in one row of light emitting units in the first display region to be different from the number of different color light emitting units in one row of light emitting units in the second display region, it is helpful to adjust the display effect of the display substrate.

Hereinafter, the display substrate and the display device provided by the embodiments of the present disclosure will be described with reference to the accompanying drawings.

Figure 2:
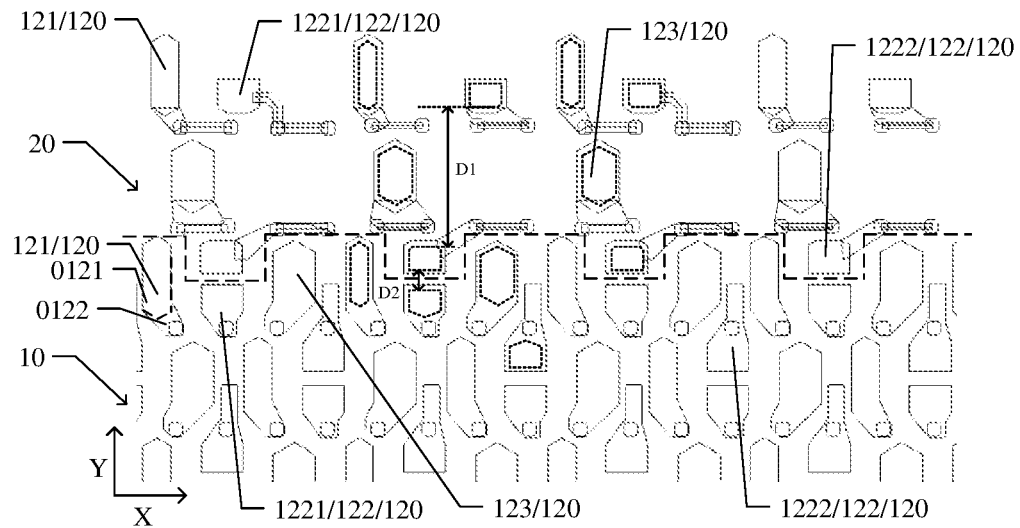
FIG. 2 is a partial view of light emitting units at an intersection position of a first display region and a second display region shown in FIG. 1.

FIG. 1 is a partial planar structural view of a display substrate provided by an embodiment of the present disclosure, and FIG. 2 is a partial view of light emitting units at an intersection position of a first display region and a second display region shown in FIG. 1. As shown in FIG. 1 and FIG. 2, the display substrate includes a first display region 10 and a second display region 20, and at least part of the first display region 10 is located on a side of the second display region 20 in the first direction. For example, the Y direction shown in FIG. 1 is the first direction, and the first display region 10 is located on a side of the second display region 20 in the Y direction. FIG. 1 merely illustratively shows the shape, size and position relationship of the first display region and the second display region. The shape of each display region in the actual product can be a regular shape or an irregular shape: for example, the second display region can include a protruding region, the first display region can include a recessed region, the protruding region of the second display region can be inserted into the recessed region of the first display region, and the protruding region of the second display region and the recessed region of the first display region can have complementary shapes. For example, a recessed region can also be provided at a side of the second display region away from the first display region.

As shown in FIG. 1 and FIG. 2, the first display region 10 includes a plurality of first light emitting unit groups 100 and a plurality of first pixel circuit groups 200 connected to the plurality of first light emitting unit groups 100, and the second display region 20 includes a plurality of second light emitting unit groups 300 and a plurality of second pixel circuit groups 400 connected to the plurality of second light emitting unit groups 300. For example, the plurality of first pixel circuit groups 200 are connected with the plurality of first light emitting unit groups 100 in one-to-one correspondence. For example, the plurality of second pixel circuit groups 400 are connected with the plurality of second light emitting unit groups 300 in one-to-one correspondence.

For example, as shown in FIG. 1, the display substrate includes a base substrate 01, and the first light emitting unit groups 100, the first pixel circuit groups 200, the second light emitting unit groups 300 and the second pixel circuit groups 400 are all located on the base substrate 01. The figure illustratively shows that the orthographic projections of the first light emitting unit group 100 and the first pixel circuit group 200 connected to the first light emitting unit group 100 on the base substrate 01 overlap with each other, and the orthographic projections of the second light emitting unit group 300 and the second pixel circuit group 400 connected to the second light emitting unit group 300 on the base substrate 01 overlap with each other. But it is not limited thereto, and the light emitting unit group and the pixel circuit group connected thereto may not overlap with each other.

As shown in FIG. 1 and FIG. 2, each light emitting unit group includes a plurality of light emitting units 120 of different colors. Here, the light emitting units of different color refer to light emitting units that emit light of different colors. For example, each light emitting unit group can include at least one of a light emitting unit emitting red light, a light emitting unit emitting green light and a light emitting unit emitting blue light. The light emitting unit as mentioned above refers to a light emitting element (e.g., an organic light emitting element), which includes a first electrode, a second electrode, and a light emitting layer between the first electrode and the second electrode: the first electrode, the light emitting layer and the second electrode are sequentially stacked along a direction perpendicular to the base substrate, and FIG. 2 illustratively shows the second electrode of each light emitting unit. For example, the second electrode of each light emitting unit includes a main body electrode and a connection electrode, the shape of the main body electrode is basically the same as the shape of the light emitting region (to be described later) of each light emitting unit, and the connection electrode is configured to be connected to a pixel circuit, for example, connected to a thin film transistor included in the pixel circuit. For example, as shown in FIG. 2, the main body electrode 0121 of the first color light emitting unit 121 in the first display region 10 is roughly hexagonal in shape, and the edges of the main body electrode 0121 surround the light emitting region, while the connection electrode 0122 is the part of the second electrode other than the main body electrode 0121, which is configured to be connected to the pixel circuit.

As shown in FIG. 1 and FIG. 2, in the first display region 10, one row of light emitting units 120 arranged along a second direction intersected with the first direction include light emitting units of N different colors: in the second display region 20, one row of light emitting units 120 arranged along the second direction include light emitting units of M different colors, where N is greater than M, and both N and M are positive integers not less than 1. The X direction shown in the figure is the second direction, and for example, the first direction and the second direction may be perpendicular to each other, but not limited thereto. For example, the first direction and the second direction can be interchanged. For example, the embodiments of the present disclosure are described by taking that the second direction is a row direction as an example. For example, the first direction can be a column direction, and the light emitting units arranged along the second direction are one row of light emitting units arranged along the row direction. The embodiments of the present disclosure are not limited thereto, and the row direction and the column direction can be interchanged.

For example, as shown in FIG. 2, in the first display region 10, one row of light emitting units 120 arranged along the second direction include light emitting units 121, 122 and 123 of three different colors: in the second display region 20, one row of light emitting units 120 arranged along the second direction include light emitting units of one color or light emitting units of two different colors, and the light emitting units of the two different colors are alternately arranged along the second direction. For example, N can be 3, and M can be 1 or 2. The embodiments of the present disclosure are not limited thereto, and one row of light emitting units arranged in the second direction in the first display region can also include light emitting units of four different colors, or light emitting units of two different colors.

For example, as shown in FIG. 1 and FIG. 2, each of first light emitting unit group 100 and each of second light emitting unit group 300 includes one first color light emitting unit 121, one second color light emitting unit pair 122 and one third color light emitting unit 123. The first light emitting unit 121 and the third color light emitting unit 123 are located in different rows, and at least one second color light emitting unit of the second color light emitting unit pair 122 and the first color light emitting unit 121 are arranged along the second direction.

For example, as shown in FIG. 2, in the first display region 10, one row of light emitting units 120 arranged along the second direction include first color light emitting units 121, second color light emitting units 1221, and third color light emitting units 123, which are repeatedly arranged in sequence: in the second display region 20, one row of light emitting units 120 arranged along the second direction include one row of third color light emitting units 123, one row of second color light emitting units 1222, or one row of first color light emitting units 121 and second color light emitting units 1221 alternately arranged.

For example, as shown in FIG. 2, in the first display region 10, one row of light emitting units 120 arranged along the second direction can include the first color light emitting unit 121, the second color light emitting unit 1221 and the third color light emitting unit 123, and can also include the first color light emitting unit 121, the second color light emitting unit 1222 and the third color light emitting unit 123; and the second color light emitting unit 1221 and the second color light emitting unit 1222 can be arranged along the first direction.

The embodiments of the present disclosure illustratively show that the first color light emitting unit can be a red light emitting unit, the second color light emitting unit can be a green light emitting unit, and the third color light emitting unit can be a blue light emitting unit. But not limited thereto, the first color light emitting unit can be a blue light emitting unit, and the third color light emitting unit can be a red light emitting unit.

For example, as shown in FIG. 1 and FIG. 2, at least one second light emitting unit group 300 in the second display region 20 can include three rows of light emitting units, which can include one row of third color light emitting units 123, one row of second color light emitting units 1222, and one row of first color light emitting units 121 and second color light emitting units 1221 alternately arranged.

For example, as shown in FIG. 2, a protruding region is provided at a side of the second display region 20 close to the first display region 10, a recessed region is provided at a side of the first display region 10 close to the second display region 20, and the protruding region of the second display region 20 can be inserted into the recessed region of the first display region 10. One row of second color light emitting units 1222 in the second display region 20 can be located in the protruding region of the second display region 20, that is, in the recessed region of the first display region 10. Therefore, one row of second color light emitting units 1222 in the second display region 20 can be located in the same row as light emitting units in the first display region 10. Here, "one row of second color light emitting units 1222 in the second display region 20 can be located in the same row as light emitting units in the first display region 10" means that a straight line extending parallel to the row direction can pass through the second color light emitting units 1222 and the light emitting units in the first display region 10.

For example, as shown in FIG. 2, in the first display region 10, the two second color light emitting units 1221 and 1222 included in the second color light emitting unit pair 122 are arranged along the first direction, and the second color light emitting unit 1222 in the second display region 20 can be substantially arranged along the first direction with the second color light emitting unit pair 122 in the first display region 10, while the second color light emitting unit 1221 in the second display region 20 can be substantially arranged along the first direction with the second color light emitting unit pair 122 in the first display region 10, or can be deviated from the second color light emitting unit pair 122 in the first display region 10 by a certain distance in the second direction. The "two second color light emitting units 1221 and 1222" can be referred to as a first light emitting unit block 1221 and a second light emitting unit block 1222, respectively.

For example, each light emitting unit includes a light emitting region, and the "light emitting region" here can refer to a two-dimensional plane region, which is parallel to the base substrate. For example, the display substrate further includes a pixel defining layer on the base substrate, the pixel defining layer includes an opening used for defining the light emitting region of the light emitting unit, and the opening exposes the second electrode of the light emitting unit. When at least part of the light emitting layer of the light emitting unit is subsequently formed in the opening of the pixel defining layer, the light emitting layer located in the opening is in contact with the second electrode, so that this part can drive the light emitting layer to emit light to form a light emitting region. It should be noted that, because of process reasons, the size of the part of the opening of the pixel defining layer away from the base substrate is slightly greater than the size of the part of the opening of the pixel defining layer close to the base substrate, or the size of the opening of the pixel defining layer gradually increases from one side close to the base substrate to the other side away from the base substrate. Therefore, the size of the light emitting region may be slightly different from the size of the opening of the pixel defining layer at different positions, but the entire regional shape and size thereof are basically the same. For example, the orthographic projection of the light emitting region on the base substrate is approximately coincident with the orthographic projection of the corresponding opening of the pixel defining layer on the base substrate. For example, the orthographic projection of the light emitting region on the base substrate completely falls within the orthographic projection of the corresponding opening of the pixel defining layer on the base substrate, and the two orthographic projections are similar in shape. The orthographic projection area of the light emitting region on the base substrate is slightly smaller than the orthographic projection area of the corresponding opening of the pixel defining layer on the base substrate.

For example, as shown in FIG. 1 and FIG. 2, in at least one second light emitting unit group 300 adjacent to the first light emitting unit group 100, the distance between two light emitting regions (dashed boxes shown in FIG. 2) of the second color light emitting unit pair 122 in the first direction is a first distance D1. The present embodiment illustratively shows the distance between the edges of the two light emitting regions close to each other in the first direction, or the distance between two points, closest to each other, of the two light emitting regions in the first direction. But not limited thereto, the first distance can also refer to the distance between the centers of two light emitting regions in the first direction, that is, the distance between two straight lines extending in the second direction (the second direction is perpendicular to the first direction) and passing through the centers of the two light emitting regions respectively. The distance between the light emitting region of the second light emitting unit block 1222 in the second color light emitting unit pair 122 of the second light emitting unit group 300 adjacent to the first light emitting unit group 100 and the light emitting region, adjacent to the light emitting region of the second light emitting unit block 1222, of the first light emitting unit block 1221 located in the first light emitting unit group 100 in the first direction is a second distance D2, and the present embodiment illustratively shows the distance between the edges of the two light emitting regions close to each other in the first direction. But not limited thereto, the second distance can also refer to the distance between the centers of two light emitting regions in the first direction, that is, the distance between two straight lines extending in the second direction (the second direction is perpendicular to the first direction) and passing through the centers of the two light emitting regions respectively. The first distance D1 is greater than the second distance D2.

It should be noted that the first distance and the second distance are both under the same definition, that is, they can both be the distance between the edges of two light emitting regions close to each other in the first direction, or the distance between the centers of two light emitting regions in the first direction, etc.

For example, as shown in FIG. 2, the second light emitting unit block 1222 in the second light emitting unit group is located in the same row as the light emitting units 120 in the first light emitting unit group, and the second light emitting unit block 1222 is closer to the first light emitting unit block 1221 in the first light emitting unit group than the first light emitting unit block 1221 in the same second light emitting unit group as the second light emitting unit block 1222 is.

For example, as shown in FIG. 2, the first distance D1 is greater than the size of the light emitting region of the third color light emitting unit 123 in the second light emitting unit group 300 in the first direction. For example, as shown in FIG. 2, in the second light emitting unit group 300, the third color light emitting unit 123 can be located between two second color light emitting units 1221 and 1222.

For example, as shown in FIG. 2, the second distance D2 is less than the size of the light emitting region of the third color light emitting unit 123 in the second light emitting unit group in the first direction. For example, as shown in FIG. 2, the second distance D2 is less than the size of the light emitting region of the third color light emitting unit 123 in the first light emitting unit group in the first direction. For example, the size of the light emitting region of the third color light emitting unit 123 in the first light emitting unit group in the first direction can be approximately equal to the size of the light emitting region of the third color light emitting unit 123 in the second light emitting unit group in the first direction. In the present disclosure, "substantially equal" means that the ratio of the difference of two items to one item of the two items is not greater than 0.2.

For example, as shown in FIG. 1 and FIG. 2, in each second light emitting unit group 300, one second color light emitting unit of the second color light emitting unit pair 122 is located in the same row as the first color light emitting unit 121, and for example, the first light emitting unit block 1221 is located in the same row as the first color light emitting unit 121. For example, as shown in FIG. 1 and FIG. 2, in the second light emitting unit group 300 adjacent to the first light emitting unit group 100, the other second color light emitting unit of the second color light emitting unit pair 122 is located in the same row as the first color light emitting unit 121 and the third color light emitting unit 123 in the first light emitting unit group 100. For example, the second light emitting unit block 1222 in the second light emitting unit group 300 is located in the same row as the first color light emitting unit 121 and the third color light emitting unit 123 in the first light emitting unit group 100.

The embodiments of the present disclosure merely illustratively show one row of second light emitting unit groups adjacent to the first light emitting unit group. The embodiments of the present disclosure are not limited to the case in which only this row of second light emitting unit groups are included. For example, the second display region can include a plurality of rows of second light emitting unit groups. In terms of a certain second light emitting unit groups other than the second light emitting unit group adjacent to the first light emitting unit group, one second color light emitting unit of the second color light emitting unit pair 122 is located in the same row as the first color light emitting unit 121, and the other second color light emitting unit of the second color light emitting unit pair 122 is located in the same row as the first color light emitting unit 121 and the third color light emitting unit 123 in another second light emitting unit group (this second light emitting unit group is a second light emitting unit group adjacent to the "certain second light emitting unit group" in the first direction).

For example, as shown in FIG. 1 and FIG. 2, the number of light emitting units in one row arranged along the second direction in the first display region 10 is greater than the number of light emitting units in one row arranged along the second direction in the second display region 20. For example, as shown in FIG. 1 and FIG. 2, the average distance between the light emitting regions of two adjacent light emitting units located in the same row in the first display region 10 is a, and the average distance between the light emitting regions of two adjacent light emitting units located in the same row in the second display region 20 is b, and a is less than b.

For example, as shown in FIG. 1 and FIG. 2, the density of the plurality of first light emitting unit groups 100 in the first display region 10 is a third density, the density of the plurality of second light emitting unit groups 300 in the second display region 20 is a fourth density, and the third density is greater than the fourth density. In the embodiments of the present disclosure, "the third density being greater than the fourth density" can mean that the number of the first light emitting unit groups is greater than the number of the second light emitting unit groups in the same area. For example, the same area can be the area of a rectangle, the long side of the rectangle is parallel to the second direction and the short side of the rectangle is parallel to the first direction. For example, the number of second light emitting unit groups in one row can be q, the long side of the rectangle can be the length of p (p is a positive integer not greater than q) second light emitting unit groups along the first direction, and the short side of the rectangle can be the length of one second light emitting unit group along the second direction. The embodiments of the present disclosure are not limited thereto.

Figure 3:
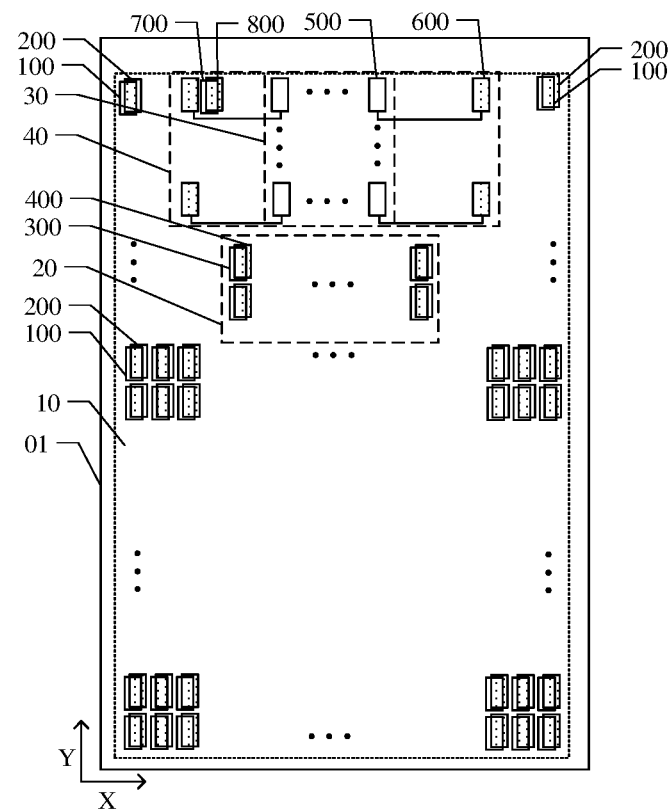
FIG. 3 is a partial planar structural view of a display substrate provided by an embodiment of the present disclosure.
Figure 4:
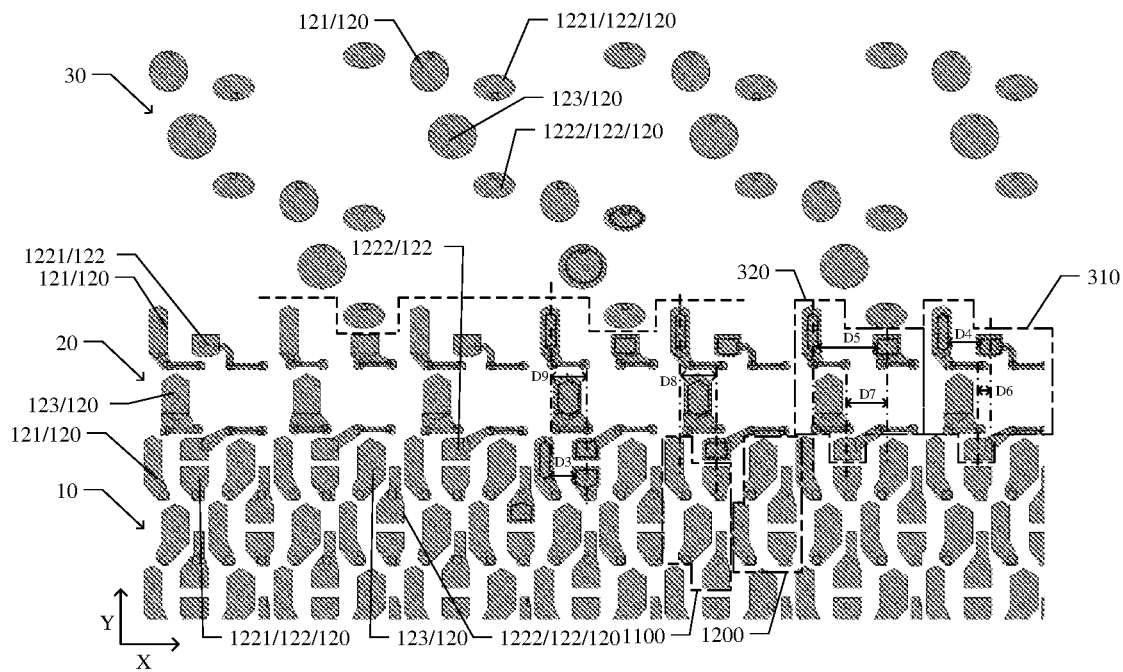
FIG. 4 is a partial view of light emitting units at intersection positions of a first display region, a second display region and a third display region in an example of the display substrate shown in FIG. 3.

For example, FIG. 3 is a partial planar structural view of a display substrate provided by an embodiment of the present disclosure, and FIG. 4 is a partial view of light emitting units at intersection positions of a first display region, a second display region and a third display region in an example of the display substrate shown in FIG. 3. As shown in FIG. 3 and FIG. 4, the display substrate further includes a third display region 30, the first display region 10 is located on at least one side of the third display region 30, and at least part of the second display region 20 is located between the first display region 10 and the third display region 30. For example, as shown in FIG. 3, the first display region 10 can surround the third display region 30. For example, the first display region 10 can be located on both sides of the third display region 30 in the X direction and on at least one side of the third display region 30 in the Y direction. For example, as shown in FIG. 3, the first display region 10 surrounds the second display region 20. For example, the first display region 10 includes parts located on both sides of the second display region 20 in the X direction and on at least one side of the second display region 20 in the Y direction. The embodiments of the present disclosure illustratively show that the position of the third display region is located in the middle of the top of the entire display region (the complete region used for display on the display substrate, including the first display region, the second display region, the third display region, etc.), but is not limited thereto, and can be set according to actual needs, and for example, at the upper left corner or the upper right corner of the entire display region. FIG. 3 illustratively shows that the shapes of the second display region and the third display region are both rectangular, but they are not limited thereto. At least one of the second display region and the third display region can also have a regular shape, such as a circle or an ellipse, etc., or an irregular shape, without being limited in the embodiments of the present disclosure.

For example, as shown in FIG. 3 and FIG. 4, the third display region 30 includes a plurality of third light emitting unit groups 500, and a plurality of third pixel circuit groups 600 connected to the plurality of third light emitting unit groups 500 are located at an outer side of the third display region 30. For example, the plurality of third pixel circuit groups 600 are connected with the plurality of third light emitting unit groups 500 in one-to-one correspondence. The light transmittance of the third display region can be improved by setting the third pixel circuit group driving the third light emitting unit group in the third display region in the region other than the third display region, that is, the light emitting unit and the pixel circuit are separately arranged to improve the light transmittance of the third display region. For example, the third display region is a region used for setting an under-screen camera. Of course, the embodiments of the present disclosure are not limited to setting a front camera module at a side of the base substrate away from the light emitting unit in the third display region, and other functional components, such as a 3D structured light module (e.g., a 3D structured light sensor), a time-of-flight 3D imaging module (e.g., a time-of-flight sensor), an infrared sensing module (e.g., an infrared sensor), etc., can also be set thereon.

For example, as shown in FIG. 3, the display substrate further includes a transition region 40 located between the first display region 10 and the third display region 30, and the transition region 40 includes two parts located on both sides of the third display region 30 in the X direction. The transition region 40 includes a plurality of fourth light emitting unit groups 700 and a plurality of fourth pixel circuit groups 800 connected to the plurality of fourth light emitting unit groups 700, and for example, the plurality of fourth pixel circuit groups 800 are connected with the plurality of fourth light emitting unit groups 700 in one-to-one correspondence. For example, the transition region 40 further includes the third pixel circuit groups 600 connected to the third light emitting unit groups 500. In the embodiments of the present disclosure, each light emitting unit and the pixel circuit connected thereto form one sub-pixel, that is, the display substrate includes a plurality of sub-pixels, and each sub-pixel includes a light emitting unit and a pixel circuit connected thereto.

For example, as shown in FIG. 3 and FIG. 4, the density of the plurality of third light emitting unit groups 500 in the third display region 30 is a fifth density, and the density of the plurality of first light emitting unit groups 100 in the first display region 10 (i.e., the third density) and the density of the plurality of second light emitting unit groups 300 in the second display region 20 (i.e., the fourth density) are both greater than the fifth density, that is, the third density is greater than the fourth density, and the fourth density is greater than the fifth density. In the embodiments of the present disclosure, the number of the first light emitting unit groups and the number of the second light emitting unit groups are both greater than the number of the third light emitting unit groups in the same area. In the embodiments of the present disclosure, the density of the first light emitting unit groups in the first display region is greater than the density of the third light emitting unit groups in the third display region. By setting the second display region between the third display region and the first display region, and setting the density of the light emitting unit groups in the second display region between the density of the light emitting unit groups in the first display region and the density of the light emitting unit groups in the third display region, the boundaries of the first display region and the third display region close to each other can be brightened. Compared with the case in which the first display region is connected with the third display region (that is, there is no second display region between the first display region and the third display region), the display substrate provided by the embodiments of the present disclosure is helpful to improve the phenomenon that the boundaries of the third display region and the first display region close to each other appears cyan or dark, and further improve the display image quality of the third display region (the region where the under-screen camera is located).

For example, the ratio of the fifth density to the third density can be in the range of 0.1-0.5, and the ratio of the fourth density to the third density can be in the range of 0.5-0.9. For example, the ratio of the fifth density to the third density can be ¼, and the ratio of the fourth density to the third density can be ½.

For example, as shown in FIG. 3 and FIG. 4, in the third display region 30, one row of light emitting units arranged along the second direction include light emitting units of one color or light emitting units of two different colors, and the light emitting units of the two different colors are alternately arranged along the second direction.

For example, as shown in FIG. 3 and FIG. 4, the third light emitting unit group 500 includes one first color light emitting unit 121, one second color light emitting unit pair 122 (including one first light emitting unit block 1221 and one second light emitting unit block 1222), and one third color light emitting unit 123. The first color light emitting unit 121 and the third color light emitting unit 123 are located in different rows, and at least one second color light emitting unit of the second color light emitting unit pair 122 and the first color light emitting unit 121 are arranged along the second direction.

For example, as shown in FIG. 3 and FIG. 4, in the third display region 30, one row of light emitting units 120 arranged along the second direction include one row of third color light emitting units 123, one row of second light emitting unit blocks 1222, or one row of first color light emitting units 121 and first light emitting unit blocks 1221 alternately arranged. For example, at least one light emitting unit group 500 in the third display region 30 can include three rows of light emitting units, which can include one row of third color light emitting units 123, one row of second light emitting unit blocks 1222, and one row of first color light emitting units 121 and first light emitting unit blocks 1221 alternately arranged.

For example, as shown in FIG. 3 and FIG. 4, the arrangement rules of different color light emitting units in the second light emitting unit group 300 can be the same as the arrangement rules of different color light emitting units in the third light emitting unit group 500.

For example, as shown in FIG. 3 and FIG. 4, a side of the third display region 30 close to the second display region 20 is provided with a protruding region, a side of the second display region 20 closed to the third display region 30 is provided with a recessed region, and the protruding region of the third display region 30 can be inserted into the recessed region of the second display region 20. One row of second light emitting unit blocks 1222 in the third display region 30 can be located in the protruding region of the third display region 30, that is, in the recessed region of the second display region 20. Therefore, one row of second light emitting unit blocks 1222 in the third display region 30 can be located in the same row as light emitting units in the second display region 20.

For example, as shown in FIG. 3 and FIG. 4, in the third display region 30, the first light emitting unit block 1221 and the second light emitting unit block 1222 included in the second color light emitting unit pair 122 are arranged along the first direction, and some of the first light emitting unit blocks 1221 in the second display region 20 and the second light emitting unit blocks 1222 in the third display region 30 can be substantially arranged along the first direction.

For example, as shown in FIG. 3 and FIG. 4, each light emitting unit in the third light emitting unit group includes a light emitting region, which can have the same definition as the light emitting region of each light emitting unit in the first light emitting unit groups and the second light emitting unit groups shown in FIG. 2. FIG. 4 shows the light emitting regions (dashed frame) of the third light emitting unit group.

For example, as shown in FIG. 3 and FIG. 4, the plurality of third light emitting unit groups 500 are arranged as a plurality of rows of third light emitting unit groups 500, two adjacent rows of third light emitting unit groups 500 are shifted along the row direction: the plurality of second light emitting unit groups 300 are arranged as at least one row of second light emitting unit groups 300, and for example, the second light emitting unit groups 300 are arranged as one row of second light emitting unit groups 300.

For example, as shown in FIG. 3 and FIG. 4, the third light emitting unit group 500 located in one of an odd row and an even row is located in the same column as an odd second light emitting unit group 300, and the third light emitting unit group 500 located in the other of the odd row and the even row is located in the same column as an even second light emitting unit group 300. In the embodiments of the present disclosure, the second light emitting unit group and the third light emitting unit group located in the same column refer to a certain second light emitting unit group and a certain third light emitting unit group in the case where the first light emitting unit block in the certain second light emitting unit group and the second light emitting unit block in the certain third light emitting unit group are located in the same column (that is, arranged along the column direction).

For example, as shown in FIG. 3 and FIG. 4, the plurality of first light emitting unit groups 100 include a plurality of columns of third sub-light emitting unit groups 1100 and a plurality of columns of fourth sub-light emitting unit groups 1200, and the plurality of columns of third sub-light emitting unit groups 1100 and the plurality of columns of fourth sub-light emitting unit groups 1200 are alternately arranged along the row direction. For example, the first color light emitting unit 121, the third color light emitting unit 123 and at least one second color light emitting unit in the second light emitting unit group 300 are located in the same column as the third sub-light emitting unit group 1100. "The first color light emitting unit 121, the third color light emitting unit 123 and at least one second color light emitting unit in the second light emitting unit group 300 being located in the same column as the third sub-light emitting unit group 1100" can mean that the first color light emitting unit in the second light emitting unit group and the first color light emitting unit in the third sub-light emitting unit group are substantially arranged along the column direction, the third color light emitting unit in the second light emitting unit group and the third color light emitting unit in the third sub-light emitting unit group are arranged along the column direction, and the second light emitting unit block in the second light emitting unit group and the first light emitting unit block in the third sub-light emitting unit group are arranged along the column direction.

For example, as shown in FIG. 3 and FIG. 4, the area ratio of the light emitting regions of light emitting units of the same color respectively in the third light emitting unit group 500 and the first light emitting unit group 100 is greater than 1. For example, the ratio of the area of the light emitting region of each first color light emitting unit 121 in the third light emitting unit group 500 to the area of the light emitting region of each first color light emitting unit 121 in the first light emitting unit group 100 is in the range of 1.1-2.5, the ratio of the area of the light emitting regions of each second color light emitting unit pair 122 in the third light emitting unit group 500 to the area of the light emitting regions of each second color light emitting unit pair 122 in the first light emitting unit group 100 is in the range of 1.1-2.5, and the ratio of the area of the light emitting region of each third color light emitting unit 123 in the third light emitting unit group 500 to the area of the light emitting region of each third color light emitting unit 123 in the first light emitting unit group 100 is in the range of 1.1-2.5.

For example, the area ratio of the light emitting regions of light emitting units of the same color respectively in the third light emitting unit group 500 and the first light emitting unit group 100 can be in the range of 1.3-2.2. For example, the area ratio of the light emitting regions of light emitting units of the same color respectively in the third light emitting unit group 500 and the first light emitting unit group 100 can be in the range of 1.5-2. For example, the area ratio of the light emitting regions of light emitting units of the same color respectively in the third light emitting unit group 500 and the first light emitting unit group 100 can be 1.8.

In research, the inventor(s) of the present application have also noticed that: in the case where the second display region is arranged between the first display region and the third display region, and the area of the light emitting region of each light emitting unit in the third display region is relatively large, in the second light emitting unit group and the third light emitting unit group located in the same column and adjacent to each other, the light emitting layer of the second color light emitting unit of the second light emitting unit group is easily overlapped with the light emitting layer of the third color light emitting unit of the third light emitting unit group. To solve the above situation, the second color light emitting units located in the same row in the second display region can be arranged at unequal intervals.

For example, as shown in FIG. 3 and FIG. 4, the plurality of second light emitting unit groups 300 include first sub-light emitting unit groups 310 and second sub-light emitting unit groups 320 alternately arranged along the second direction, and at least one third light emitting unit group 500 in one row of third light emitting unit groups 500 adjacent to the plurality of second sub-light emitting unit groups 320 among the plurality of third light emitting unit group 500 are located in the same column as the second sub-light emitting unit groups 320. For example, the third light emitting unit group 500 adjacent to the second sub-light emitting unit group 320 is located in the same column as the second sub-light emitting unit group 320. For example, the second light emitting unit block 1222 in the third light emitting unit group 500 adjacent to a second light emitting unit group 300 is located in the same row as the first color light emitting unit 121 in the second light emitting unit group 300.

For example, as shown in FIG. 3 and FIG. 4, in at least one first light emitting unit group 100, the distance between the light emitting region of the first color light emitting unit 121 and the light emitting region of the first light emitting unit block 1221 is a third distance D3: in at least one first sub-light emitting unit group 310, the distance between the light emitting region of the first color light emitting unit 121 and the light emitting region of the first light emitting unit block 1221 is a fourth distance D4: in at least one second sub-light emitting unit group 320, the distance between the light emitting region of the first color light emitting unit 121 and the light emitting region of the first light emitting unit block 1221 is a fifth distance D5, the fifth distance D5 is greater than the fourth distance D4, and the fourth distance D4 is greater than the third distance D3. For example, the fifth distance D5 can be in the range of 50-60 microns, the fourth distance D4 can be in the range of 28-35 microns, and the third distance D3 can be in the range of 20-27 microns.

The embodiments of the present disclosure illustratively show that the distance between two light emitting regions refers to the distance between the edges of the two light emitting regions close to each other, but it is not limited thereto. The distance between two light emitting regions can also be the distance between the centers of the two light emitting regions in the second direction, that is, the distance between two straight lines extending in the first direction (the second direction is perpendicular to the first direction) and passing through the centers of the two light emitting regions respectively. In the embodiments of the present disclosure, by setting one row of first light emitting unit blocks in the second display region at unequal intervals, the light emitting layer of the first light emitting unit block in the second display region can be prevented from overlapping with the light emitting layer of the third color light emitting unit in the third display region.

For example, as shown in FIG. 3 and FIG. 4, in at least one first sub-light emitting unit group 310, the distance between two center lines extending in the first direction in two light emitting regions of the second color light emitting unit pair 122 is a sixth distance D6: in at least one second sub-light emitting unit group 320, the distance between two center lines extending in the first direction in two light emitting regions of the second color light emitting unit pair 122 is a seventh distance D7, and the seventh distance D7 is greater than the sixth distance D6.

For example, as shown in FIG. 3 and FIG. 4, in at least one first sub-light emitting unit group 310, the distance between the center line extending in the first direction in the light emitting region of the first color light emitting unit 121 and the center line extending in the first direction in the light emitting region of the second light emitting unit block 1222 is an eighth distance D8: in at least one second sub-light emitting unit group 320, the distance between the center line extending in the first direction in the light emitting region of the first color light emitting unit 121 and the center line extending in the first direction in the light emitting region of the second light emitting unit block 1222 is a ninth distance D9, and the ratio of the ninth distance D9 to the eighth distance D8 is in the range of 0.8-1.2.

For example, as shown in FIG. 3 and FIG. 4, in the second display region 20, first color light emitting units 121 in one row are arranged at equal intervals, second light emitting unit blocks 1222 in one row are arranged at equal intervals, third color light emitting units 123 in one row are arranged at equal intervals, and first light emitting unit blocks 1221 in one row are arranged at unequal intervals, thus facilitating the manufacture of the rest light emitting units other than the first light emitting unit block 1221 in the second light emitting unit group and saving the cost.

For example, as shown in FIG. 3 and FIG. 4, in the first light emitting unit group 100 and the second light emitting unit group 300, the light emitting regions of the first color light emitting units 121 have approximately the same shape and the same area; in the first light emitting unit group 100 and the second light emitting unit group 300, the light emitting regions of the third color light emitting units 123 have approximately the same shape and the same area. For example, in the first light emitting unit group 100, the shapes of the light emitting regions of the first color light emitting unit 121 and the third color light emitting unit 123 include hexagons: in the second light emitting unit group 300, the shapes of the light emitting regions of the first color light emitting unit 121 and the third color light emitting unit 123 include hexagons.

For example, in each light emitting unit group, the area of the light emitting region of the third color light emitting unit 123 is greater than the area of the light emitting region of the first color light emitting unit 121.

For example, as shown in FIG. 3 and FIG. 4, the shape of the light emitting region of the first light emitting unit block 1221 in the first light emitting unit group 100 is different from the shape of the light emitting region of the first light emitting unit block 1221 in the second light emitting unit group 300, and the shape of the light emitting region of the second light emitting unit block 1222 in the first light emitting unit group 100 is different from the shape of the light emitting region of the second light emitting unit block 1222 in the second light emitting unit group 300. For example, the shapes of the first light emitting unit block 1221 and the second light emitting unit block 1222 in the first light emitting unit group 100 can both be pentagonal, and the shapes of the first light emitting unit block 1221 and the second light emitting unit block 1222 in the second light emitting unit group 300 can both be substantially rectangular, thus preventing the second electrode of the third color light emitting unit in the second light emitting unit group from spatially colliding with the second electrode of the second light emitting unit block, and preventing the second electrode of the first color light emitting unit in the second light emitting unit group from spatially colliding with the second electrode of the first light emitting unit block.

For example, the area of the light emitting region of the second color light emitting unit in the first light emitting unit group 100 is different from the area of the light emitting region of the second color light emitting unit in the second light emitting unit group 300. For example, the area of the light emitting region of the second color light emitting unit in the first light emitting unit group 100 is greater than the area of the light emitting region of the second color light emitting unit in the second light emitting unit group 300.

For example, as shown in FIG. 3 and FIG. 4, in the first light emitting unit group 100 and the third light emitting unit group 500, the shapes of light emitting regions of light emitting units emitting light of the same color are different. For example, in the third light emitting unit group 500, the shape of the light emitting region of each light emitting unit includes a circle, an ellipse or a water droplet-shape. The circle includes a standard circle and an approximate circle, and the approximate circle can include an approximate circle with a notch at its edge, an approximate circle with a diameter ratio of 0.9-1.1 extending in all directions, etc. The ellipse includes a standard ellipse and an approximate ellipse, and the approximate ellipse can include an approximate ellipse with a notch at its edge, an approximate ellipse with a diameter ratio of 0.9-1.1 extending in all directions, etc.

For example, in the third light emitting unit group 500, the shapes of the light emitting regions of the first color light emitting unit 121 and the third color light emitting unit 123 are both circles, and the shapes of the light emitting regions of the two second color light emitting units are both ellipses, the long axis of which is along the second direction.

For example, the edge of the opening of the pixel defining layer used for defining the light emitting region of each light emitting unit in the third light emitting unit group includes a protrusion, and the light emitting layer formed in the opening includes a notch, that is, the light emitting region includes a notch where the second electrode of the light emitting unit is connected to the thin film transistor.

Figure 5A:
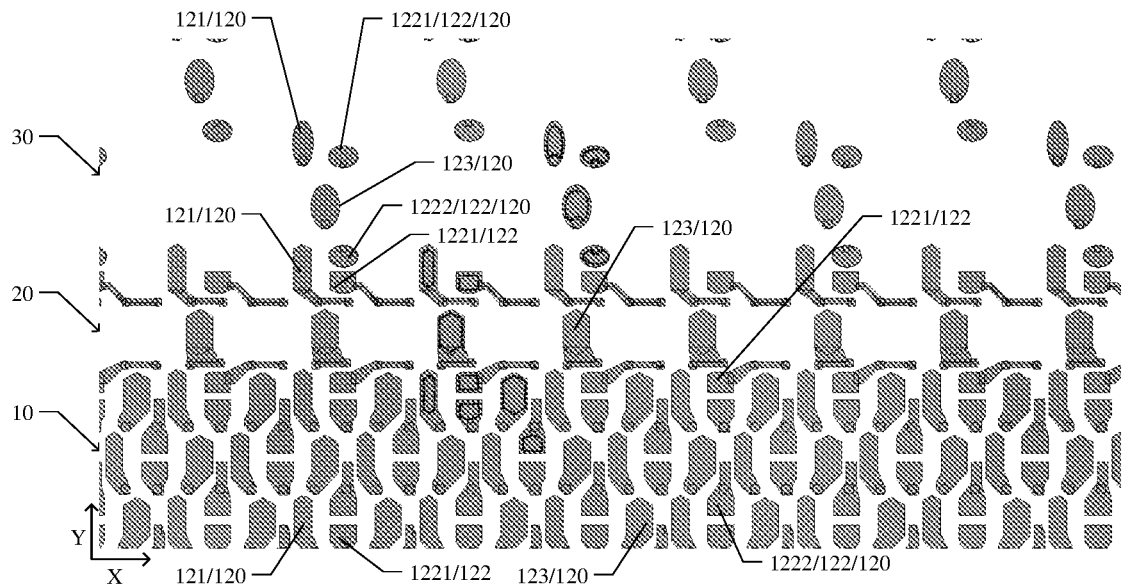
FIG. 5A is a partial view of light emitting units at intersection positions of a first display region, a second display region and a third display region in another example of the display substrate shown in FIG. 3.

For example, FIG. 5A is a partial view of light emitting units at intersection positions of a first display region, a second display region and a third display region in another example of the display substrate shown in FIG. 3. The difference between the example shown in FIG. 5A and the example shown in FIG. 4 includes that the area ratios of the light emitting regions of light emitting units of the same color in the third light emitting unit group 500 and the first light emitting unit group 100 are different.

For example, as shown in FIG. 3 and FIG. 5A, the area ratio of the light emitting regions of light emitting units, of the same color, respectively in the third light emitting unit group 500 and the first light emitting unit group 100 is not greater than 1. For example, the ratio of the area of the light emitting region of each first color light emitting unit 121 in the third light emitting unit group 500 to the area of the light emitting region of each first color light emitting unit 121 in the first light emitting unit group 100 is in the range of 0.5-1, the ratio of the area of the light emitting regions of each second color light emitting unit pair 122 in the third light emitting unit group 500 to the area of the light emitting regions of each second color light emitting unit pair 122 in the first light emitting unit group 100 in the range of is 0.5-1, and the ratio of the area of the light emitting region of each third color light emitting unit 123 in the third light emitting unit group 500 to the area of the light emitting region of each third color light emitting unit 123 in the first light emitting unit group 100 is in the range of 0.5-1. For example, the area ratio of the light emitting regions of light emitting units, of the same color, respectively in the third light emitting unit group 500 and the first light emitting unit group 100 is in the range of 0.6-0.9. For example, the area ratio of the light emitting regions of light emitting units, of the same color, respectively in the third light emitting unit group 500 and the first light emitting unit group 100 is in the range of 0.7-0.8.

For example, the difference between the example shown in FIG. 5A and the example shown in FIG. 4 further includes that in the second display region 20, the first color light emitting units 121 are arranged at equal intervals, the second light emitting unit blocks 1222 are arranged at equal intervals, the third color light emitting units 123 are arranged at equal intervals, and the first light emitting unit blocks 1221 are arranged at equal intervals. In the present example, because the area ratio of the light emitting regions of light emitting units, of the same color, respectively in the third light emitting unit group 500 and the first light emitting unit group 100 is not greater than 1, the problem that the light emitting layer of the first light emitting unit block in the second display region overlaps the light emitting layer of the third color light emitting unit in the third display region is not easy to occur, and therefore, the distance between the light emitting region of the first color light emitting unit and the light emitting region of the second color light emitting unit adjacent to each other in each second light emitting unit group is equal.

For example, as shown in FIG. 3 and FIG. 5A, in the first light emitting unit group 100 and the third light emitting unit group 500, the shapes of light emitting regions of light emitting units emitting light of the same color are different.

For example, in the third light emitting unit group 500, the shape of the light emitting region of each light emitting unit includes a circle, an ellipse or a droplet-shape. The circle includes a standard circle and an approximate circle, and the approximate circle can include an approximate circle with a notch at its edge, an approximate circle with a diameter ratio of 0.9-1.1 extending in all directions, etc. The ellipse includes a standard ellipse and an approximate ellipse, and the approximate ellipse can include an approximate ellipse with a notch at its edge, an approximate ellipse with a diameter ratio of 0.9-1.1 extending in all directions, etc.

For example, in the third light emitting unit group 500, the shapes of the light emitting regions of the first color light emitting unit 121 and the third color light emitting unit 123 are both ellipses, the long axis of which is along the first direction, and the shapes of the light emitting regions of the second light emitting unit blocks 1222 and 1221 are both ellipses, the long axis of which is along the second direction.

For example, the edge of the opening of the pixel defining layer used for defining the light emitting region of each light emitting unit in the third light emitting unit group includes a protrusion, and the light emitting layer formed in the opening includes a notch, that is, the light emitting region includes a notch where the second electrode of the light emitting unit is connected to the thin film transistor.

For example, the first light emitting unit group in the example shown in FIG. 5A have the same features as the first light emitting unit group in the example shown in FIG. 4, which will not be repeated here. For example, in terms of the second light emitting unit group in the example shown in FIG. 5A and the second light emitting unit group in the example shown in FIG. 4, except that the distribution rules of the first light emitting unit blocks 1221 are different, other light emitting units in the example shown in FIG. 5A have the same features as other light emitting units in the example shown in FIG. 4, which will not be repeated here.

Figure 5B:
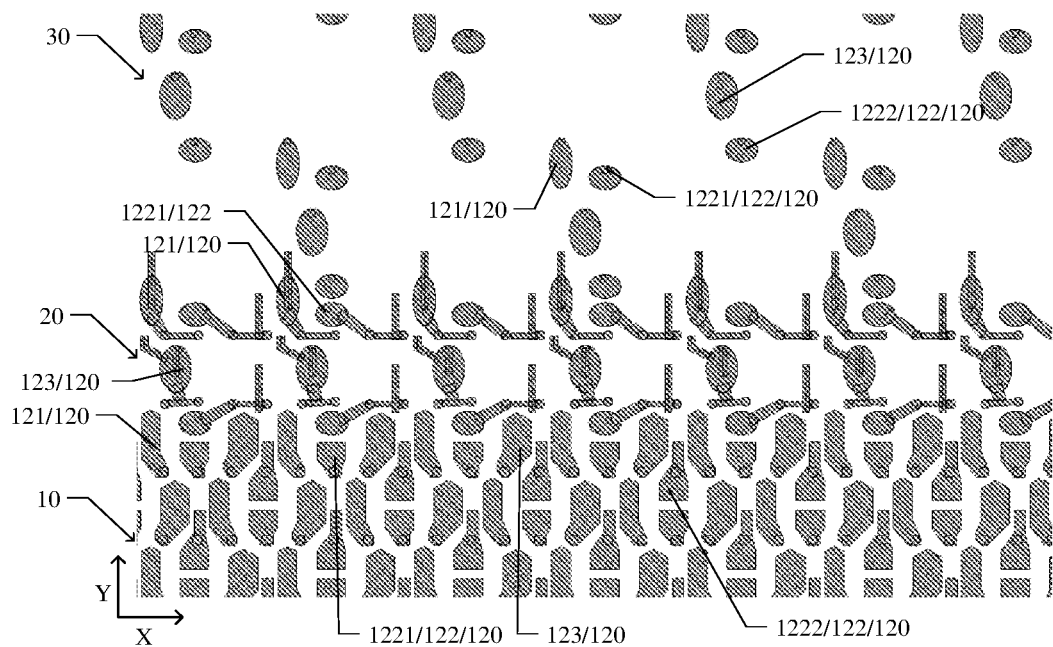
FIG. 5B is a partial view of light emitting units at intersection positions of a first display region, a second display region and a third display region in further another example of the display substrate shown in FIG. 3.

For example, FIG. 5B is a partial view of light emitting units at intersection positions of a first display region, a second display region and a third display region in further another example of the display substrate shown in FIG. 3. The difference between the example shown in FIG. 5B and the example shown in FIG. 5A includes that the shapes of light emitting regions in the second light emitting unit groups are different. For example, as shown in FIG. 5B, in the second light emitting unit group 300 and the third light emitting unit group 500, the light emitting regions of light emitting units emitting light of the same color have approximately the same shape and the same area.

For example, the first light emitting unit group in the example shown in FIG. 5B have the same features as the first light emitting unit group in the example shown in FIG. 4, which will not be repeated here. For example, the third light emitting unit group in the example shown in FIG. 5B have the same features as the third light emitting unit group in the example shown in FIG. 5A, which will not be repeated here. For example, in terms of the second light emitting unit group in the example shown in FIG. 5B and the second light emitting unit group in the example shown in FIG. 4, except that the distribution rules of the first light emitting unit blocks 1221 are different and the shapes of the light emitting units are different, other light emitting units in the example shown in FIG. 5B have the same features as other light emitting units in the example shown in FIG. 4, which will not be repeated here.

For example, the plurality of first pixel circuit groups 200 include a plurality of first pixel circuits 210, and the plurality of second pixel circuit groups 400 include a plurality of second pixel circuits 410. For example, in at least one second pixel circuit group 400, each second pixel circuit 410 includes two sub-pixel circuits 411 and 412, which are configured to be connected to the same light emitting unit (e.g., the first color light emitting unit, the second color light emitting unit or the third color light emitting unit), and for example, the two sub-pixel circuits are connected to the second electrode of the same light emitting unit. For example, in the first pixel circuit group 200, each first pixel circuit 210 includes one sub-pixel circuit, and different sub-pixel circuits are configured to be connected to different light emitting units, that is, one sub-pixel circuit is only connected to the second electrode of one light emitting unit. For example, the sub-pixel circuit included in the second pixel circuit can have the same structure as the sub-pixel circuit included in the first pixel circuit.

Figure 6:
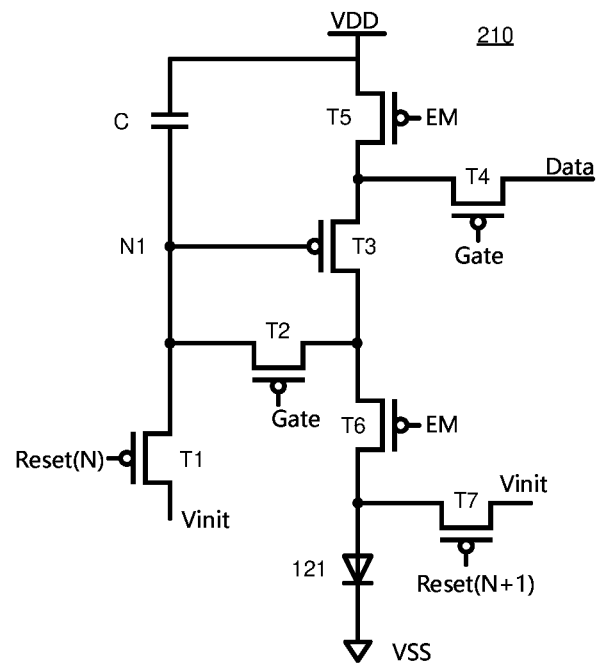
FIG. 6 is an equivalent diagram of a sub-pixel circuit included in a first pixel circuit.

For example, FIG. 6 is an equivalent diagram of a sub-pixel circuit included in a first pixel circuit. For example, the first pixel circuit shown in FIG. 6 is configured to drive the first color light emitting unit, and the equivalent diagram of the first pixel circuit driving other color light emitting unit is the same as the equivalent diagram shown in FIG. 6. As shown in FIG. 6, the first pixel circuit 210 includes a second reset transistor T1, a second light emitting control transistor T5, a first light emitting control transistor T6, a data writing transistor T4, a driving transistor T3, a threshold compensation transistor T2, a first reset control transistor T7, and a storage capacitor C. For example, the display substrate further includes a reset power signal line, a scan signal line, a power signal line, a reset control signal line, a light emitting control signal line, and a data line.

For example, the first electrode of the threshold compensation transistor T2 is connected to the first electrode of the driving transistor T3, and the second electrode of the threshold compensation transistor T2 is connected to the gate electrode of the driving transistor T3; the first electrode of the first reset control transistor T7 is connected to the reset power signal line to receive a reset signal Vinit, and the second electrode of the first reset control transistor T7 is connected to the second electrode of the light emitting unit (e.g., the first light emitting unit 121); the first electrode of the data writing transistor T4 is connected to the second electrode of the driving transistor T3, the second electrode of the data writing transistor T4 is connected to the data line to receive a data signal Data, and the gate electrode of the data writing transistor T4 is electrically connected to the scan signal line to receive a scan signal Gate: the first electrode of the storage capacitor C is electrically connected to the power signal line, and the second electrode of the storage capacitor C is electrically connected to the gate electrode of the driving transistor T3; the gate electrode of the threshold compensation transistor T2 is electrically connected to the scan signal line to receive a compensation control signal; the gate electrode of the first reset transistor T7 is electrically connected to a reset control signal line to receive a reset control signal Reset (N+1): the first electrode of the second reset transistor T1 is electrically connected to the reset power signal line to receive the reset signal Vinit, the second electrode of the second reset transistor T1 is electrically connected to the gate electrode of the driving transistor T3, and the gate electrode of the second reset transistor T1 is electrically connected to a reset control signal line to receive a reset control signal Reset (N); the gate electrode of the first light emitting control transistor T6 is electrically connected to the light emitting control signal line to receive a light emitting control signal EM: the first electrode of the second light emitting control transistor T5 is electrically connected to the power signal line to receive a first power signal VDD, the second electrode of the second light emitting control transistor T5 is electrically connected to the second electrode of the driving transistor T3, the gate electrode of the second light emitting control transistor T5 is electrically connected to the light emitting control signal line to receive the light emitting control signal EM, and the first electrode of the first light emitting unit 121 is connected to a voltage terminal VSS. The power signal line refers to a signal line that outputs the voltage signal VDD, and can be connected with a voltage source to output a constant voltage signal, such as a positive voltage signal.

For example, the scan signal and the compensation control signal can be the same, that is, the gate electrode of the data writing transistor T3 and the gate electrode of the threshold compensation transistor T2 can be electrically connected to the same signal line to receive the same signal, thus reducing the number of signal lines. For example, the gate electrode of the data writing transistor T3 and the gate electrode of the threshold compensation transistor T2 can also be electrically connected to different signal lines, that is, the gate electrode of the data writing transistor T3 is electrically connected to a first scan signal line, the gate electrode of the threshold compensation transistor T2 is electrically connected to a second scan signal line, and the signals transmitted by the first scan signal line and the second scan signal line can be the same or different, so that the gate electrode of the data writing transistor T3 and the gate electrode of the threshold compensation transistor T2 can be separately and independently controlled, thus increasing the flexibility of controlling the pixel circuit.

For example, the light emitting control signals inputting to the first light emitting control transistor T6 and the second light emitting control transistor T5 can be the same, that is, the gate electrode of the first light emitting control transistor T6 and the gate electrode of the second light emitting control transistor T5 can be electrically connected to the same signal line to receive the same signal, thereby reducing the number of signal lines. For example, the gate electrode of the first light emitting control transistor T6 and the gate electrode of the second light emitting control transistor T5 can be electrically connected to different light emitting control signal lines, and the signals transmitted by different light emitting control signal lines can be the same or different.

For example, the reset control signals inputting to the first reset transistor T7 and the second reset transistor T1 can be the same, that is, the gate electrode of the first reset transistor T7 and the gate electrode of the second reset transistor T1 can be electrically connected to the same signal line to receive the same signal, thus reducing the number of signal lines. For example, the gate electrode of the first reset transistor T7 and the gate electrode of the second reset transistor T1 can be electrically connected to different reset control signal lines, and the signals on different reset control signal lines can be the same or different.

For example, as shown in FIG. 6, when the display substrate is in operation, in a first stage of screen display, the second reset transistor T1 is turned on to initialize the voltage of the N1 node; in a second stage of screen display, the data Data is stored at the N1 node through the data writing transistor T4, the driving transistor T3 and the threshold compensation transistor T2; in a third stage (light emitting stage) of screen display, the second light emitting control transistor T5, the driving transistor T3 and the first light emitting control transistor T6 are all turned on, and the light emitting unit is forwardly turned on to emit light.

It should be noted that, in the embodiments of the present disclosure, in addition to the 7T1C (i.e., seven transistors and one capacitor) structure shown in FIG. 6, the pixel circuit of the sub-pixel can be a structure including other numbers of transistors, such as a 7T2C structure, a 6T1C structure, a 6T2C structure or a 9T2C structure, without being limited in the embodiments of the present disclosure.

Figure 7:
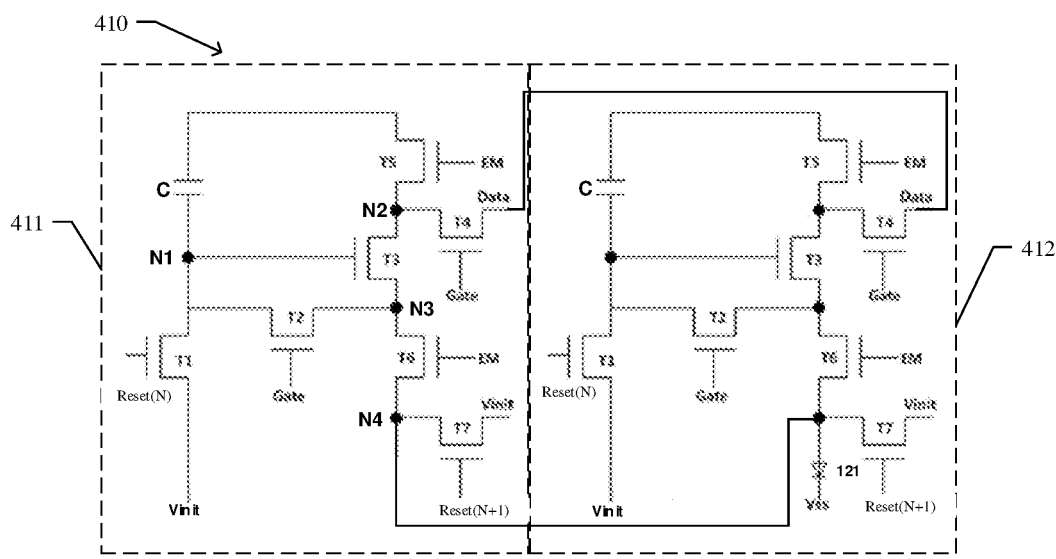
FIG. 7 is an equivalent diagram of two sub-pixel circuits included in a second pixel circuit.

For example, FIG. 7 is an equivalent diagram of two sub-pixel circuits included in one second pixel circuit. For example, the second pixel circuit shown in FIG. 7 is configured to drive the first color light emitting unit, and the equivalent diagram of the second pixel circuit driving other color light emitting units is the same as the equivalent diagram shown in FIG. 7. As shown in FIG. 7, the equivalent diagram of either of the two sub-pixel circuits 411 and 412 in the second pixel circuit 410 is basically the same as the equivalent diagram of the sub-pixel circuit of the first pixel circuit 210 shown in FIG. 6, and for example, both of them have a 7T1C structure. In the second pixel circuit 410, the data writing transistors T4 of the two sub-pixel circuits are connected, and the N4 nodes of the two sub-pixel circuits are connected to jointly drive the same light emitting unit to emit light.

For example, as shown in FIG. 7, when the display substrate is in operation, in the first stage of screen display, the second reset transistor T1 is turned on to initialize the voltage of the N1 node: in the second stage, the same data signal Data is stored at two N1 nodes of two pixel circuits through two connected data writing transistors T4, two driving transistors T3 respectively connected with the two connected data writing transistors T4, and two threshold compensation transistors T2: in the third stage (the light emitting stage), the second light emitting control transistors T5, the driving transistors T3 and the first light emitting control transistors T6 in the two sub-pixel circuits 411 and 412 are all turned on to transmit the same data signal to the two N4 nodes, and at this time, the N4 nodes of the two sub-pixel circuits 411 and 412 are connected to jointly drive the same light emitting unit (e.g., the first light emitting unit 121) to emit light. In the embodiments of the present disclosure, the second pixel circuit in the second display region adopts the design of double 7T1C, which can achieve the purpose of increasing current and brightness.

For example, the third pixel circuit group includes a plurality of third pixel circuits, and the fourth pixel circuit group includes a plurality of fourth pixel circuits; the third pixel circuit and the fourth pixel circuit can have the same equivalent circuit diagram as the first pixel circuit or the same equivalent circuit diagram as the second pixel circuit. For example, in an example of the present disclosure, both the third pixel circuit and the fourth pixel circuit have the same equivalent circuit diagram as the second pixel circuit, and the third pixel circuit and the fourth pixel circuit each includes two sub-pixel circuits; the two sub-pixel circuits are configured to be connected to the same light emitting unit (e.g., the first color light emitting unit, the second color light emitting unit or the third color light emitting unit), and for example, the two sub-pixel circuits are connected to the second electrode of the same light emitting unit, which can achieve the purpose of increasing current and brightness.

Figure 8:
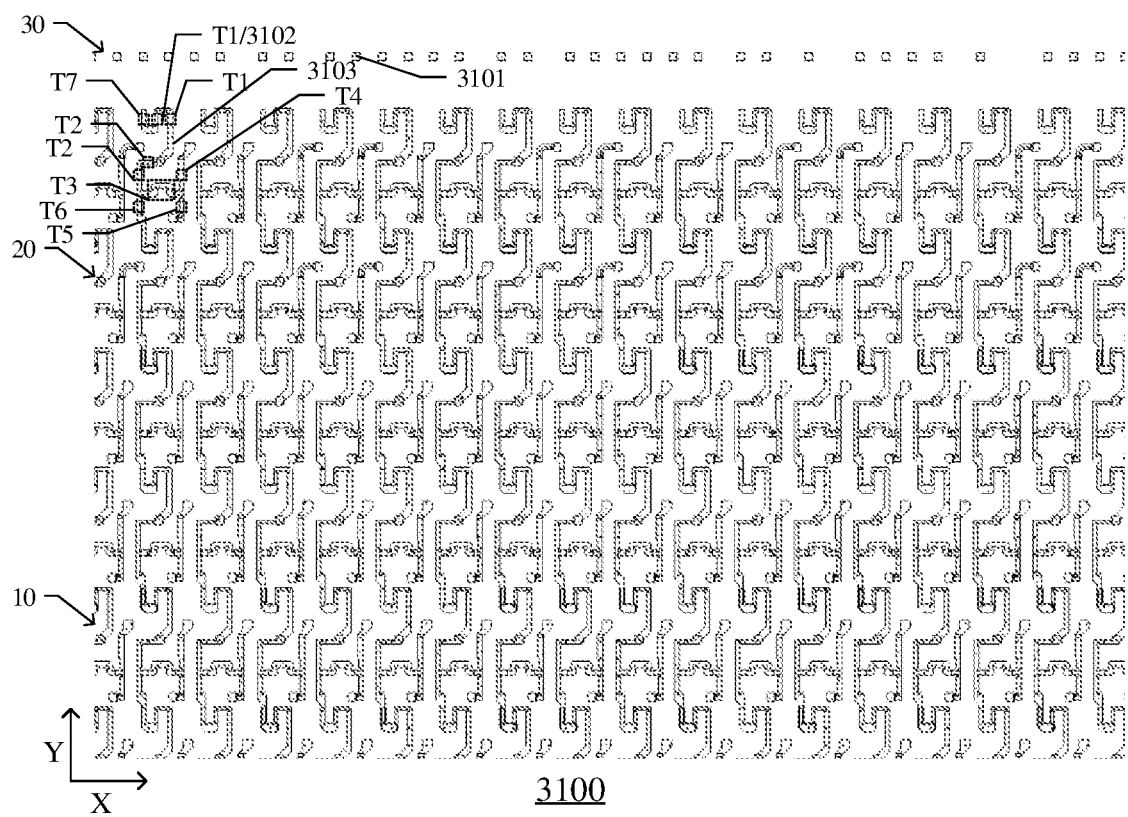
FIG. 8 is a partial planar structural view of an active semiconductor layer at an intersection position of a third display region and a second display region and at an intersection position of a first display region and the second display region, provided by an embodiment of the present disclosure.
Figure 9:
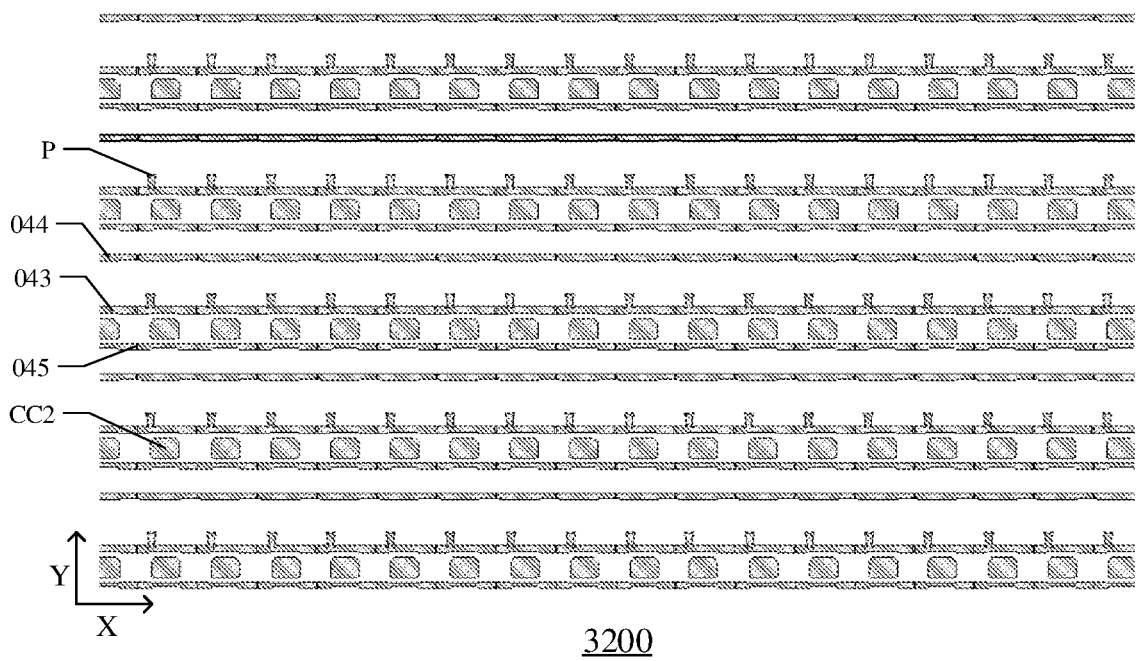
FIG. 9 is a partial planar structural view of a first conductive layer at an intersection position of a third display region and a second display region and at an intersection position of a first display region and the second display region, provided by an embodiment of the present disclosure.
Figure 10:
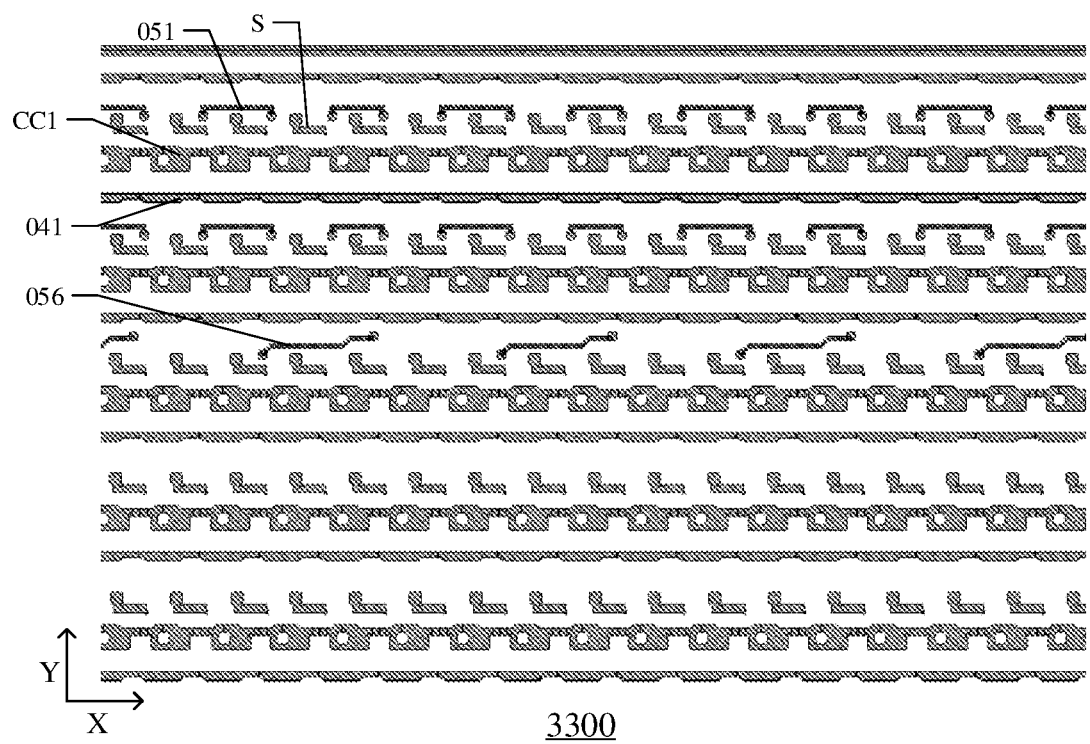
FIG. 10 is a partial planar structural view of a second conductive layer at an intersection position of a third display region and a second display region and at an intersection position of a first display region and the second display region, provided by an embodiment of the present disclosure.
Figure 11:
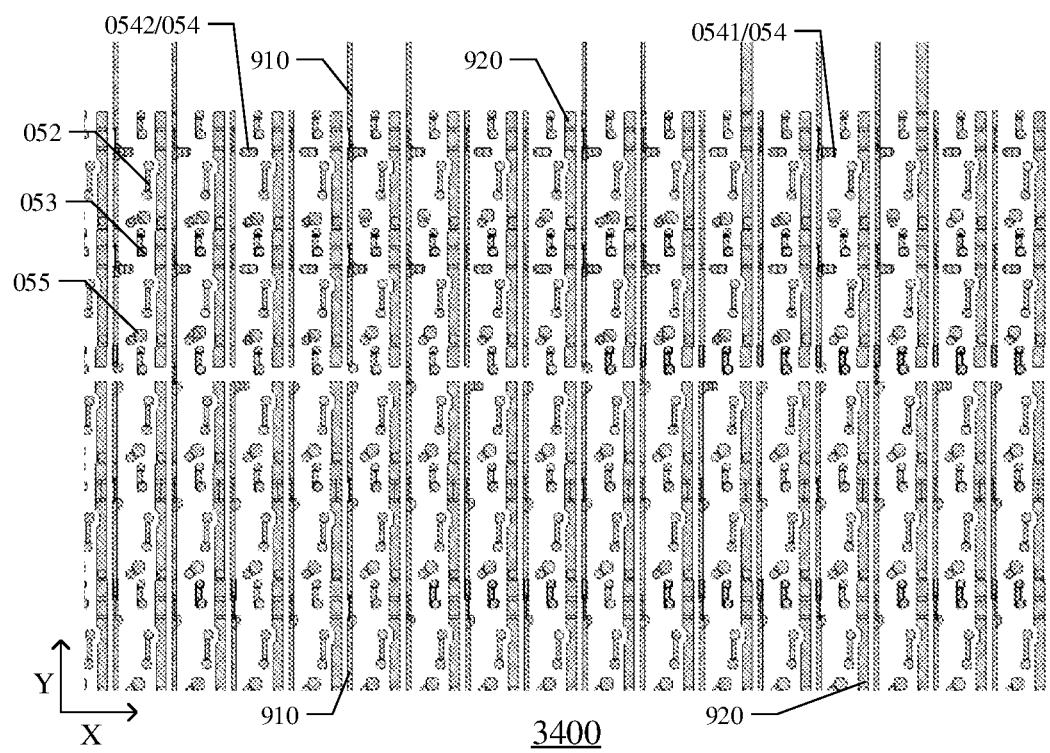
FIG. 11 is a partial planar structural view of a source-drain metal layer at an intersection position of a third display region and a second display region and at an intersection position of a first display region and the second display region, provided by an embodiment of the present disclosure.
Figure 12:
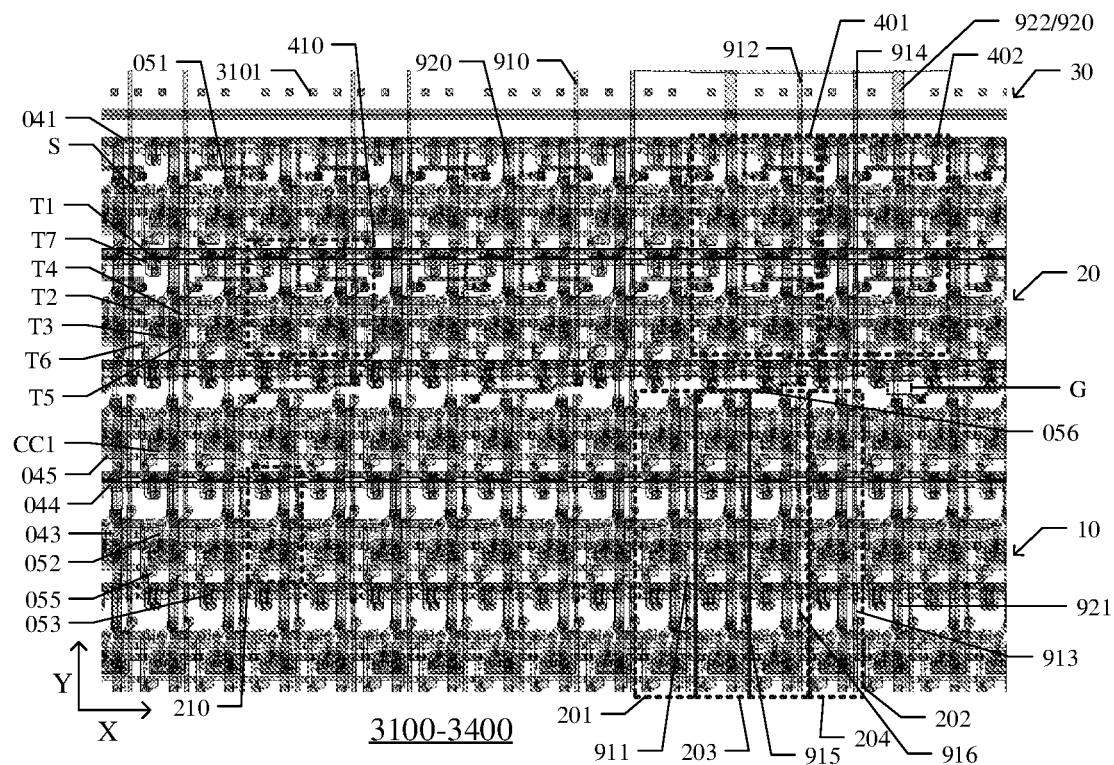
FIG. 12 is a schematic diagram of lamination of the active semiconductor layer, the first conductive layer, the second conductive layer and the source-drain metal layer shown in FIGS. 8-11.

For example, FIG. 8 is a partial planar structural view of an active semiconductor layer at an intersection position of a third display region and a second display region and at an intersection position of a first display region and the second display region, provided by an embodiment of the present disclosure; FIG. 9 is a partial planar structural view of a first conductive layer at an intersection position of a third display region and a second display region and at an intersection position of a first display region and the second display region, provided by an embodiment of the present disclosure; FIG. 10 is a partial planar structural view of a second conductive layer at an intersection position of a third display region and a second display region and at an intersection position of a first display region and the second display region, provided by an embodiment of the present disclosure; FIG. 11 is a partial planar structural view of a source-drain metal layer at an intersection position of a third display region and a second display region and at an intersection position of a first display region and the second display region, provided by an embodiment of the present disclosure; and FIG. 12 is a schematic diagram of lamination of the active semiconductor layer, the first conductive layer, the second conductive layer and the source-drain metal layer shown in FIGS. 8-11.

For example, as shown in FIGS. 8-12, the active semiconductor layer 3100 can be formed by patterning a semiconductor material. The active semiconductor layer 3100 can be used to manufacture the active layers of the second reset transistor T1, the threshold compensation transistor T2, the driving transistor T3, the data writing transistor T4, the second light emitting control transistor T5, the first light emitting control transistor T6 and the first reset control transistor T7. The active semiconductor layer 3100 includes an active layer pattern (channel region) and a doped region pattern (source-drain doped region) of each transistor of each sub-pixel, and the active layer patterns and the doped region patterns of the transistors in the same pixel circuit are integrated.

It should be noted that the active layer can include an integrated low-temperature poly-silicon layer, and the source region and the drain region can be conducted by doping or the like to realize the electrical connection of structures. That is, the active semiconductor layers of the transistors of each sub-pixel is an integral pattern formed of poly-silicon, each transistor in the same pixel circuit includes a doped region pattern (i.e., a source region and a drain region) and an active layer pattern, and the active layers of different transistors are separated by a doped structure.

For example, the active semiconductor layer 3100 can be made of amorphous silicon, poly-silicon or an oxide semiconductor material, etc. It should be noted that the source region and the drain region can be regions doped with N-type impurities or P-type impurities.

In FIG. 8, the dashed rectangular frames show the overlapping portions between the first conductive layer 3200 and the active semiconductor layer 3100. As the channel region of each transistor (i.e., the above-mentioned active layer pattern), the active semiconductor layers on both sides of each channel region are conducted as the first and second electrodes (i.e., the above-mentioned doped region patterns) of each transistor by ion doping or other processes. The source electrode and the drain electrode of the transistor can be symmetrical in structure, so the source electrode and the drain electrode can have no difference in physical structure. In the embodiments of the present disclosure, in order to distinguish the electrodes of the transistor, except that the gate electrode serves as a control electrode, one of the remaining electrodes is directly described as a first electrode, and the other of the remaining electrodes is directly described as a second electrode, so the first electrode and the second electrode of all or part of the transistors in the embodiments of the present disclosure are interchangeable as needed.

For example, among the plurality of first pixel circuit groups, the plurality of second pixel circuit groups and the plurality of third pixel circuit groups, each pixel circuit group includes a plurality of thin film transistors, and for example, the plurality of thin film transistors include a second reset transistor T1, a threshold compensation transistor T2, a driving transistor T3, a data writing transistor T4, a second light emitting control transistor T5, a first light emitting control transistor T6 and a first reset control transistor T7.

For example, the active semiconductor layer 3100 includes an active layer pattern 3102 and doped region patterns 3103 of each thin film transistor, and the active semiconductor layer 3100 further includes a dummy pattern 3101. For example, the dummy pattern 3101 can be located in the third display region 30. For example, the dummy pattern 3101 can include a plurality of block patterns arranged along the second direction, and the plurality of block patterns can be evenly distributed or unevenly distributed, without being limited in the embodiments of the present disclosure.

For example, the display substrate includes a gate insulating layer located on a side of the active semiconductor layer away from the base substrate, which is configured to insulate the active semiconductor layer 3100 from a first conductive layer 3200 (i.e., the gate metal layer) to be subsequently formed. FIG. 9 shows the first conductive layer 3200 included in the display substrate, and the first conductive layer 3200 is disposed on the gate insulating layer, so as to be insulated from the active semiconductor layer 3100. The first conductive layer 3200 can include a second electrode CC2 of the capacitor C, and a plurality of scan signal lines 043, a plurality of reset control signal lines 044 and a plurality of light emitting control signal lines 045 extending in the second direction (X direction in the figure), and the gate electrodes of the second reset transistor T1, the threshold compensation transistor T2, the driving transistor T3, the data writing transistor T4, the second light emitting control transistor T5, the first light emitting control transistor T6 and the first reset control transistor T7.

For example, as shown in FIGS. 8-12, the gate electrode of the data writing transistor T3 can be a portion of the scan signal line 043 overlapping with the active semiconductor layer 3100: the gate electrode of the first light emitting control transistor T6 can be a first portion of the light emitting control signal line 045 overlapping with the active semiconductor layer 3100, and the gate electrode of the second light emitting control transistor T5 can be a second portion of the light emitting control signal line 045 overlapping with the active semiconductor layer 3100. The gate electrode of the second reset transistor T1 is a first portion of the reset control signal line 044 overlapping with the active semiconductor layer 3100, and the gate electrode of the first reset control transistor T7 is a second portion of the reset control signal line 044 overlapping with the active semiconductor layer 3100. The threshold compensation transistor T2 can be a thin film transistor with a dual-gate structure, a first gate electrode of the threshold compensation transistor T2 can be a portion of the scan signal line 043 overlapping with the active semiconductor layer 3100, and a second gate electrode of the threshold compensation transistor T2 can be a portion, overlapping with the active semiconductor layer 3100, of a protruding structure P protruding from the scan signal line 043. As shown in FIG. 9, the gate electrode of the driving transistor T1 can be the second electrode CC2 of the capacitor C.

For example, as shown in FIGS. 8-12, the scan signal line 043, the reset control signal line 044 and the light emitting control signal line 045 are arranged along the first direction (Y direction). The scan signal line 043 is located between the reset control signal line 044 and the light emitting control signal line 045.

For example, in the first direction, the second electrode CC2 of the capacitor C (i.e., the gate electrode of the driving transistor T1) is located between the scan signal line 043 and the light emitting control signal line 045. The protruding structure P protruding from the scan signal line 043 is located on a side of the scan signal line 043 away from the light emitting control signal line 045.

For example, the gate insulating layer located on a side of the first conductive layer 3200 away from the active semiconductor layer 3100 includes a plurality of via holes, which are configured to expose the doped region patterns and the dummy patterns in the active semiconductor layer 3100.

For example, a first insulating layer is formed on the first conductive layer 3200 to insulate the first conductive layer 3200 from the second conductive layer 3300 to be subsequently formed.

For example, the first insulating layer includes via holes for exposing the dummy patterns, the doped region patterns of part of the thin film transistors, and the second electrode CC2 of the capacitor C.

For example, as shown in FIGS. 8-12, the second conductive layer 3300 includes the first electrode CC1 of the capacitor C and a plurality of reset power signal lines 041 extending in the second direction. The first electrode CC1 of the capacitor C at least partially overlaps with the second electrode CC2 of the capacitor C to form the capacitor C.

For example, as shown in FIGS. 8-12, the source-drain metal layer 3400 includes a data line 910 and a power signal line 920 extending in the second direction. The data line 910 is electrically connected to the second electrode of the data writing transistor T2 through a via hole penetrating the gate insulating layer, the first insulating layer and the second insulating layer. The power signal line 920 (e.g., the power signal line located in the first display region) is electrically connected to the first electrode of the second light emitting control transistor T5 through a via hole penetrating the gate insulating layer, the first insulating layer and the second insulating layer. The power signal lines 920 and the data lines 910 are alternately arranged in the first direction. The power signal line 920 is electrically connected to the first electrode CC1 of the capacitor C through a via hole penetrating the second insulating layer.

For example, a passivation layer and a planarization layer can be disposed on a side of the source-drain metal layer 3400 away from the base substrate to protect the source-drain metal layer 3400.

For example, as shown in FIGS. 8-12, the display substrate provided by the embodiments of the present disclosure further includes a plurality of first connecting portions 051, a first end of at least part of the first connecting portions 051 is connected to the second electrode of the data writing transistor T4 of one sub-pixel circuit in the second pixel circuit 410, and a second end of the first connecting portion 051 is connected to the second electrode of the data writing transistor T4 of the other sub-pixel circuit in the second pixel circuit 410, so that the two data writing transistors T4 of the second pixel circuit 410 are connected to the same data line 910. For example, along the first direction, at least a part of the first connecting portion 051 is located between the second electrode of the data writing transistor T2 and the first electrode of the first reset control transistor T7 in one sub-pixel circuit.

In the embodiments of the present disclosure, the second electrodes of the data writing transistors of at least two sub-pixel circuits (i.e., at least one second pixel circuit) in the second display region are connected by the first connecting portion to drive the same light emitting unit to emit light, which can increase the current and brightness of the light emitting unit in the second display region. For example, the current and brightness of the light emitting unit in the second display region can be increased to 1.8-2 times that in the case of driving by one sub-pixel circuit, and a more uniform visual display effect of full screen can be realized.

For example, along the first direction, the first connecting portion 051 is located between the second electrode of the threshold compensation transistor T3 and the first electrode of the first reset control transistor T7 in one sub-pixel circuit.

For example, the first connection portion 051 is arranged in the same layer as the reset power signal line 041.

For example, a second insulating layer is formed on the second conductive layer 3300, which is configured to insulate the second conductive layer 3300 from the source-drain metal layer 3400 to be subsequently formed.

For example, the second insulating layer includes via holes that expose structures, such as the dummy patterns, etc.

For example, the source-drain metal layer is connected to the doped region pattern through the first via hole in the insulating layer between the source-drain metal layer and the active semiconductor layer. In the embodiments of the present disclosure, the dummy pattern is arranged at the position outside the edge of the second display region, and the insulating layer between the source-drain metal layer and the active semiconductor layer is patterned (e.g., etched) to expose the dummy pattern, so that the insulating layer in the second display region can be uniformly etched to form the via hole, thereby ensuring that the via hole in the insulating layer and corresponding to the driving transistor in the second display region has better etching uniformity. For example, the insulating layer between the dummy pattern and the planarization layer is patterned to form a via hole to expose the dummy pattern, and the planarization layer is configured to fill the via hole.

For example, as shown in FIGS. 8-12, the second pixel circuit 410 includes two adjacent sub-pixel circuits, the two adjacent sub-pixel circuits drive the same light emitting unit to emit light, and two data writing transistors of the adjacent two sub-pixel circuits are connected to the same data line. The first pixel circuit 210 includes only one sub-pixel circuit, each of two adjacent sub-pixel circuits drives one light emitting unit to emit light, and the two data writing transistors in the two adjacent pixel circuits are independent of each other and connected to different data lines respectively. The layout difference between the first pixel circuit and the second pixel circuit in the embodiments of the present disclosure mainly lies in whether the first connecting portion is provided, the position of the second electrode of the data writing transistor connected to the first connecting portion, and the positional relationship between the data line and the fourth connecting portion in the source-drain metal layer.

For example, as shown in FIGS. 8-12, the density of the plurality of first pixel circuits 210 is a first density, the density of the plurality of second pixel circuits 410 is a second density, and the first density is not less than the second density. For example, the first density is greater than the second density. In the embodiments of the present disclosure, "the first density being greater than the third density" can mean that the number of first pixel circuits is greater than the number of second pixel circuits in the same area.

For example, as shown in FIGS. 8-12, each first pixel circuit 210 includes only one sub-pixel circuit, and each second pixel circuit 410 includes two sub-pixel circuits. The density of sub-pixel circuits in the first display region is approximately equal to the density of sub-pixel circuits in the second display region, that is, the number of sub-pixel circuits included in the first pixel circuit is approximately equal to the number of sub-pixel circuits included in the second pixel circuit in the same area.

For example, in the case where each second pixel circuit includes two sub-pixel circuits, it can be that only one sub-pixel circuit is connected to the light emitting unit, or the two sub-pixel circuits are connected to the same light emitting unit, without being limited in the embodiments of the present disclosure. In the case where two sub-pixel circuits are connected to the same light emitting unit, the current and brightness of the light emitting unit can be increased, and a more uniform full-screen visual display effect can be realized.

For example, as shown in FIGS. 8-12, each pixel circuit further includes a second connecting portion 052 and a third connecting portion 053 arranged in the same layer as the data line 910, the second connecting portion 052 is configured to connect the second electrode of the threshold compensation transistor T2 with the gate electrode of the driving transistor T3, and the third connecting portion 053 is configured to connect the first electrode of the first reset control transistor T7 with the reset power signal line 041. For example, one end of the second connecting portion 052 is electrically connected to the second electrode of the threshold compensation transistor T2 through a via hole penetrating the gate insulating layer, the first insulating layer and the second insulating layer, and the other end of the second connecting portion 052 is electrically connected to the gate electrode of the driving transistor T3 (i.e., the second electrode CC2 of the capacitor C) through a via hole penetrating the first insulating layer and the second insulating layer. One end of the third connecting portion 053 is electrically connected to the reset power signal line 041 through a via hole penetrating the second insulating layer, and the other end of the third connecting portion 053 is electrically connected to the first electrode of the first reset control transistor T7 through a via hole penetrating the gate insulating layer, the first insulating layer and the second insulating layer.

For example, as shown in FIGS. 8-12, the first connecting portion 051 and the data line 910 are located in different layers, and each first connecting portion 051 overlaps with the data line 910 and the power signal line 920 along the third direction perpendicular to the base substrate. For example, one data line 910 and one power signal line 920 are arranged between two data writing transistors T4 included in the second pixel circuit 410, and the first connecting portion 051 connecting the two data writing transistors T4 overlaps with both the data line 910 and the power signal line 920.

For example, as shown in FIGS. 8-12, each pixel circuit further includes a fourth connecting portion 054 arranged in the same layer as the data line 910, and the fourth connecting portion 054 is configured to connect the first connecting portion 051 with the second electrode of the data writing transistor T4. The fourth connecting portion 054 of one sub-pixel circuit in the second pixel circuit 410 is spaced apart from the adjacent data line 910, and the fourth connecting portion 054 of the other sub-pixel circuit in the second pixel circuit 410 is integrated with the data line 910, so that the second pixel circuit 410 is connected with only one data line 910. The "adjacent data line" in the above-mentioned "the fourth connecting portion 054 being spaced apart from the adjacent data line 910" means that there is no other data line between the fourth connecting portion 054 and the data line 910.

For example, as shown in FIGS. 8-12, the fourth connecting portion 054 integrated with the data line 910 is taken as a first sub-portion 0541, and the fourth connecting portion 054 spaced apart from the data line 910 is a second sub-portion 0542. Because there is no pixel circuit pair design in the first pixel circuit, the fourth connecting portions of two adjacent pixel circuits arranged along the first or second direction in the first pixel circuit are integrated with the data line to realize the electrical connection between each pixel circuit and a corresponding data line.

For example, as shown in FIGS. 8-12, the display substrate further includes a plurality of covering portions S arranged in the same layer as the first connecting portion 051, and each threshold compensation transistor T2 includes two gate electrodes and an active semiconductor layer 3100 located between the two gate electrodes. In the third direction, the covering portion S overlaps with the active semiconductor layer 3100 between the two gate electrodes, the data line 910 and the power signal line 920.

For example, in the case where the threshold compensation transistor T2 is turned off, the active semiconductor layer between the two channels of the dual-gate threshold compensation transistor T2 is in a floating state, and it is easy to jump under the influence of the surrounding line voltage, which will affect the leakage current of the threshold compensation transistor T2, and further, affect the luminous brightness. In order to keep the voltage of the active semiconductor layer between the two channels of the threshold compensation transistor T2 stable, the covering portion S is designed to form a capacitor with the active semiconductor layer between the two channels of the threshold compensation transistor T2. The covering portion S can be connected to the power signal line 920 to obtain a constant voltage, and therefore, the voltage of the active semiconductor layer in a floating state can be kept stable. The covering portion S overlaps with the active semiconductor layer between the two channels of the dual-gate threshold compensation transistor T2, which can also prevent the active semiconductor layer between the two gate electrodes from being illuminated to change its characteristics, and for example, prevent the voltage of this part of the active semiconductor layer from changing, so as to avoid crosstalk. For example, the power signal line 920 can be electrically connected to the covering portion S through a via hole penetrating the second insulating layer, so as to provide a constant voltage to the covering portion S.

For example, as shown in FIGS. 8-12, the first connecting portion 051 includes a main body connecting portion extending in the second direction, and two end portions located at both ends of the main body connecting portion and extending in the second direction. The two end portions are connected to two fourth connecting portions 054 of the second pixel circuit 410, respectively, and the main body connecting portion and the two end portions are formed in a broken line shape to keep a distance from the covering portion. The shape of the first connecting portion is not limited in the embodiments of the present disclosure, so long as it can keep a certain distance from other structures arranged in the same layer. For example, the main body connecting portion of the first connecting portion can be straight, broken or wavy.

For example, in the first direction, the distance between the covering portion S and the second electrode of the threshold compensation transistor T2 is less than the distance between the covering portion S and the first electrode of the first reset control transistor T7, that is, the covering portion S is closer to the threshold compensation transistor T2. Therefore, in order to facilitate design and keep a certain distance between the first connecting portion 051 and the covering portion S, the first connecting portion 051 is arranged closer to the first electrode of the first reset transistor T7.

For example, as shown in FIG. 8-12, the plurality of data lines 910 include first sub-data lines 911 and second sub-data lines 912: the first display region 10 includes a first pixel circuit column 201, and the second display region 20 includes a second pixel circuit column 401. For example, the first pixel circuit column 201 includes one column of sub-pixel circuits, and the second pixel circuit column 401 includes two columns of sub-pixel circuits.

For example, as shown in FIGS. 8-12, the first pixel circuit column 201 and the second pixel circuit column 401 are located in different columns, that is, any sub-pixel circuit column in the second pixel circuit column 401 is located in a different column from the first pixel circuit column. For example, the first sub-data line 911 is connected to the first pixel circuit column 201, and the second sub-data line 912 is connected to the second pixel circuit column 401, and for example, the second sub-data line 912 is connected to one column of sub-pixel circuits in the second pixel circuit column 401.

For example, as shown in FIGS. 8-12, the first sub-data line 911 and the second sub-data line 912 are connected by a data line connecting portion 056, the extending direction of the data line connecting portion 056 is intersected with the first direction, and the data line connecting portion 056 and the data line 910 are located in different layers.

For example, as shown in FIGS. 1-12, at the boundary between the first display region 10 and the second display region 20, that is, at the gap between the first pixel circuit 210 and the second pixel circuit 410, some data lines are provided with breaks so that some data lines located in the first display region 10 and the second display region 20 are disconnected at the gap. In the embodiments of the present disclosure, the boundary between the first display region 10 and the second display region 20 refers to the gap between the first electrode of the first reset transistor and the second electrode of the data write transistor of the pixel circuit in one pixel circuit row in the first display region 10 and close to the second display region 20.

For example, as shown in FIGS. 1-12, a data line 910 located on the same straight line (a straight line extending in the Y direction) as a first sub-data line 911 and located in the second display region 20 is spaced apart from the first sub-data line 911, and the data line 910 located in the second display region 20 is not configured to transmit a data signal: the first sub-data line 911 and a second sub-data line 912 are connected by a data line connecting portion 056, so that the first sub-data line 911 and the second sub-data line 912 are configured to transmit the same data signal. For example, as shown in FIGS. 1-12, the second sub-data line 912 is not only connected to the second pixel circuit column 401, but also bypasses the edge of the third display region and passes through the transition region, so as to provide a data signal for the sub-pixel circuit in the transition region.

For example, as shown in FIGS. 8-12, the first display region 10 further includes a third pixel circuit column 202, and the second display region 20 further includes a fourth pixel circuit column 402. For example, the third pixel circuit column 202 includes one column of sub-pixel circuits, and the fourth pixel circuit column 402 includes two columns of sub-pixel circuits. For example, the third pixel circuit column 202 and at least part of the fourth pixel circuit column 402 are located in the same column, and for example, the third pixel circuit column 202 is located in the same column as one column of sub-pixel circuits in the fourth pixel circuit column 402.

For example, as shown in FIGS. 8-12, the plurality of data lines 910 further include a third sub-data line 913 and a fourth sub-data line 914, the third sub-data line 913 is connected to the third pixel circuit column 202, and the fourth sub-data line 914 is connected to the fourth pixel circuit column 402. For example, the fourth sub-data line 914 is connected to one column of sub-pixel circuits in the fourth pixel circuit column 402.

For example, as shown in FIGS. 8-12, one third sub-data line 913 and one fourth sub-data line 914 are one continuous data line extending in the first direction.

For example, as shown in FIGS. 1-12, at the boundary between the first display region 10 and the second display region 20, that is, at the gap between the first pixel circuit 210 and the second pixel circuit 410, some data lines are continuous, so that the continuous data line is configured to transmit the same data signal to the first pixel circuit and the second pixel circuit connected thereto.

For example, as shown in FIGS. 1-12, the data line 910 further includes a fifth sub-data line 915 and a sixth sub-data line 916, the first display region 10 further includes a fifth pixel circuit column 203 and a sixth pixel circuit column 204, the fifth sub-data line 915 is connected to the fifth pixel circuit column 203, and the sixth sub-data line 916 is connected to the sixth pixel circuit column 204. The fifth sub-data line 915 is insulated from the data lines in the second display region 20, the sixth sub-data line 916 is insulated from the data lines in the second display region 20, and the fifth sub-data line 915 and the sixth sub-data line 916 are only configured to provide data signals to the first pixel circuits in the first display region 10.

For example, as shown in FIG. 12, the fifth pixel circuit column 203 is located in the same column as one column of sub-pixel circuits of the second pixel circuit column 401, and the sixth pixel circuit column 204 is located in the same column as the other column of sub-pixel circuits of the second pixel circuit column 401.

For example, as shown in FIG. 12, the data line located on the same straight line as the fifth sub-data line 915 and located in the second display region 20 is not connected to any pixel circuit, and is spaced apart from the fifth sub-data line 915. The data line located on the same straight line as the sixth sub-data line 916 and located in the second display region 20 is not connected to any pixel circuit, and is spaced apart from the sixth sub-data line 916.

Figure 13:
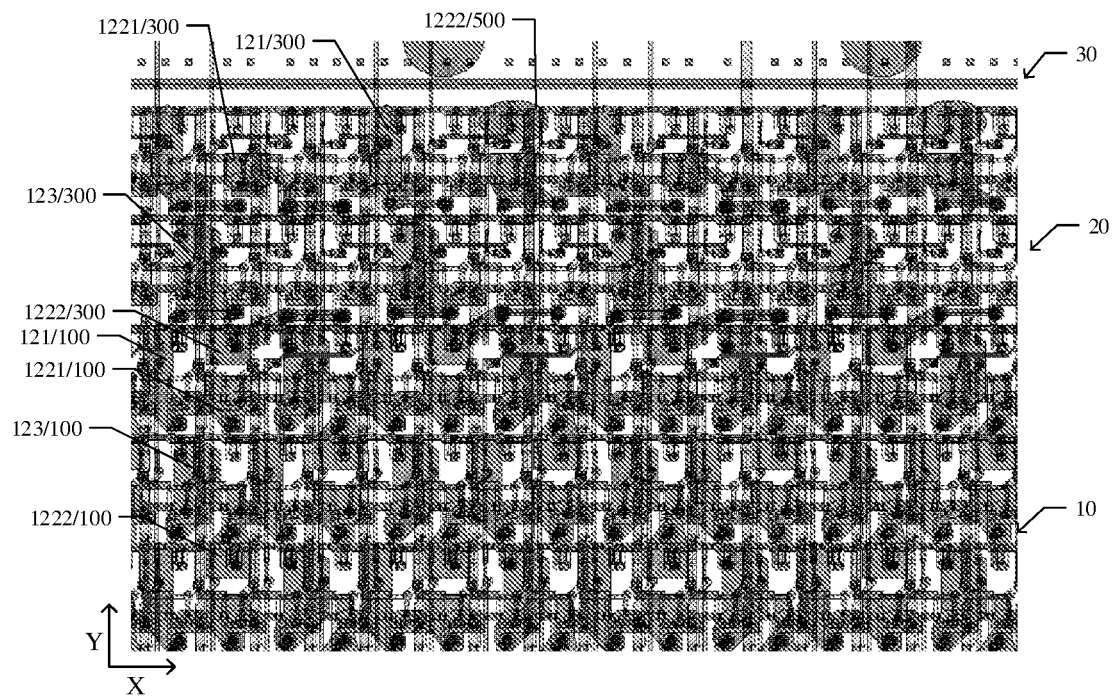
FIG. 13 is a partial planar structural view of second electrodes of the light emitting units shown in FIG. 4 which are arranged on the pixel circuit layout shown in FIG. 12.

For example, FIG. 13 is a partial planar structural view of a second electrode of a light emitting unit shown in FIG. 4 which is arranged on the pixel circuit layout shown in FIG. 12. As shown in FIGS. 1-13, the second display region 20 can include three rows of light emitting units, the second pixel circuits connected to the three rows of light emitting units are arranged in two rows, and the second light emitting unit block 1222 in the second light emitting unit group 300 is located in the same row as the first color light emitting unit 121 and the third color light emitting unit 123 in the first light emitting unit group 100, but the second pixel circuit connected to the second light emitting unit block 1222 in the second light emitting unit group 300 and the first pixel circuit 210 connected to the first light emitting unit block 121 in the first light emitting unit group 100 are located in different rows.

In the embodiments of the present disclosure, the data signal is transmitted, by a data line, from the source drive integrated circuit located at a side of the first display region away from the second display region to the pixel circuits in the first display region and the second display region and to some pixel circuits in the transition region. The data signal transmitted to the pixel circuits connected to light emitting units of one color in the second display region should be the same as the data signal transmitted to the pixel circuits connected to light emitting units of the same color in the first display region. And the data signal transmitted to the pixel circuits connected to light emitting units of one color in the second display region should be the same as the data signal transmitted to the pixel circuits connected to light emitting units of the same color in the transition region. Therefore, in the case where the same first pixel circuit column in the first display region is connected to the same data line and two sub-pixel circuits of the second pixel circuits in the second display region are connected to the same data line, it easily occurs, for example, that the data signal transmitted to the first pixel circuit connected to the first color light emitting unit in the first display region is the same as the data signal transmitted to the second pixel circuit connected to the second color light emitting unit pair in the second display region, resulting in data signal mismatch between the first display region and the second display region.

For example, as shown in FIGS. 1-13, in the embodiments of the present disclosure, it is taken as an example that the plurality of light emitting units connected to the third sub-pixel circuit column 202 in the first display region 10 include a first color light emitting unit 121 and a third color light emitting unit 123, the plurality of light emitting units connected to the first pixel circuit column 201 in the first display region 10 include a second color light emitting unit pair 122, the light emitting units connected to the second pixel circuit column 401 in the second display region 20 include a second color light emitting unit pair 122, and the light emitting units connected to the fourth pixel circuit column 402 in the second display region 20 include a first color light emitting unit 121 and a third color light emitting unit 123.

For example, in the first display region 10, the first color light emitting unit 121 and the third color light emitting unit 123 are located in different rows, the first light emitting unit block 1221 and the second light emitting unit block 1222 are arranged along the Y direction, the first light emitting unit pair 121 and the second color light emitting unit pair 122 are arranged along the X direction, and the directions, in which the first color light emitting unit 121 points to the third color light emitting unit 123, in two adjacent first light emitting unit groups 100 are opposite to each other.

For example, the first pixel circuit column 201, the fifth pixel circuit column 203, the sixth pixel circuit column 204 and the third pixel circuit column 202 form one pixel circuit column group, and the light emitting units, connected to four first pixel circuits which are in one row of first pixel circuits in the first display region 10 and close to the second display region 20 and are located in one pixel circuit column group, are one first light emitting unit block 1221, one third color light emitting unit 123, one second light emitting unit block 1221 and one first color light emitting unit 121 in turn. Four light emitting units, connected to four first pixel circuits which are in the pixel circuit column group and a second row of pixel circuits in the first display region and close to the second display region, are one second light emitting unit block 1222, one first color light emitting unit 121, one first light emitting unit block 1221 and one third color light emitting unit 123 in turn. Therefore, the arrangement manner of the first light emitting unit and the third color light emitting unit connected to the pixel circuits of the fifth pixel circuit column is different from the arrangement manner of the first light emitting unit and the third color light emitting unit connected to the pixel circuits of the third pixel circuit column, and the arrangement manner of the first light emitting unit block and the second light emitting unit block connected to the pixel circuits of the first pixel circuit column is different from the arrangement manner of the first light emitting unit block and the second light emitting unit block connected to the pixel circuits of the sixth pixel circuit column. The data signal transmitted by the data line is related to the arrangement of light emitting units of a corresponding color, and a matched data signal should be transmitted in the first display region and the second display region according to the arrangement manners of the light emitting units.

For example, as shown in FIGS. 1-13, the plurality of light emitting units 20 connected to the fourth pixel circuit column 402 in the second display region 20 include first color light emitting units 121 and third color light emitting units 123 alternately arranged, and the light emitting units connected to the pixel circuits located in one row close to the first display region 10 in the second display region 20 and serving as the second pixel circuits column 401 are, for example, the third color light emitting units 123. The plurality of light emitting units connected to the third pixel circuit columns 202 in the first display region 10 include first color light emitting units 121 and third color light emitting units 123 alternately arranged, and the light emitting units connected to the pixel circuits located in one row close to the second display region 20 in the first display region 10 and serving as the third pixel circuit columns 202 are the first color light emitting units 121. Therefore, the pixel circuits, which are in one pixel circuit row close to the second display region and in the first display region and are connected to the third sub-data lines, are connected to the first color light emitting units, and the pixel circuits, which are in one pixel circuit row close to the first display region and in the second display region and are connected to the fourth sub-data lines, are connected to the third color light emitting units. The arrangement manner of the light emitting units is matched with the data signal transmitted by the third sub-data line, and the third sub-data line and the fourth sub-data line are one continuous data line extending in the first direction, that is, the third sub-data line and the fourth sub-data line can be connected at the boundary between the first display region and the second display region, without any need to be disconnected at the boundary between the two display regions.

For example, as shown in FIGS. 1-13, the plurality of second color light emitting unit pairs 122 connected to the second pixel circuit column 401 in the second display region 20 include first light emitting unit blocks 1221 and second light emitting unit blocks 1222 alternately arranged, and the light emitting units connected to the pixel circuits located in one row close to the first display region 10 in the second display region 20 and serving as the second pixel circuit columns 401 are, for example, the second light emitting unit blocks 1222. The plurality of second color light emitting unit pairs 122 connected to the sixth pixel circuit column 204 in the first display region 10 include first light emitting unit blocks 1221 and second light emitting unit blocks 1222 alternately arranged, and the light emitting units connected to the pixel circuits located in one row close to the second display region 20 in the first display region 10 and serving as the sixth pixel circuit columns 204 are also the second light emitting unit blocks 1222. Therefore, light emitting units connected to the pixel circuits in one pixel circuit row close to the second display region in the first display region and serving as the second pixel circuit columns are the same light emitting units as light emitting units connected to the pixel circuits in one pixel circuit row close to the first display region in the first second region and serving as the sixth pixel circuit columns, and the data signal of the second sub-data line connected to the second pixel circuit column in the first display region and the data signal of the sixth sub-data line connected to the sixth pixel circuit column in the second display region are not matched, and therefore, the second sub-data line is spaced apart from the sixth sub-data line at the boundary between the first display region and the second display region.

For example, as shown in FIGS. 1-13, the plurality of second color light emitting unit pairs 122 connected to the first pixel circuit column 201 in the first display region 10 include first light emitting unit blocks 1221 and second light emitting unit blocks 1222 alternately arranged, and the light emitting units connected to the pixel circuits in one row close to the second display region 20 in the first display region 10 and serving as the first sub-pixel circuit columns 201 are the first light emitting unit blocks 1221. Therefore, the data signal of the second sub-data line connected to the second pixel circuit column in the second display region is matched with the data signal of the first sub-data line connected to the first pixel circuit column of the first display region, and the first sub-data line located in the first display region is connected to the second sub-data line located in the second display region through the data line connecting portion, so as to meet the unified algorithm processing of the integrated circuit (IC) on the first display region and the second display region.

In the embodiments of the present disclosure, at the intersection position of the first display region and the second display region, the first sub-data line and the second sub-data line are connected by the data line connecting portion, thus ensuring that the data signal transmitted from the data line to the light emitting units in the first display region is matched with the data signal transmitted from the data line to the light emitting units in the second display region.

For example, as shown in FIGS. 1-13, the data line connecting portion 056 is located in a different layer from the plurality of data lines 910.

For example, as shown in FIGS. 1-13, the data line connecting portion 056 is located in the same layer as the reset power signal line 041, so as to facilitate design.

For example, as shown in FIGS. 8-13, the plurality of power signal lines 920 include a plurality of first sub-power signal lines 921 and a plurality of second sub-power signal lines 922, the plurality of first sub-power signal lines 921 are connected to the plurality of first pixel circuit groups 200, the plurality of second sub-power signal lines 922 are connected to the plurality of second pixel circuit groups 400, each first sub-power signal line 921 is configured to transmit a first power signal, and each second sub-power signal line 922 is configured to transmit a second power signal. In the embodiments of the present disclosure, in the case where the first pixel circuit includes only one sub-pixel circuit and the second pixel circuit includes two sub-pixel circuits, the power signals required by the first pixel circuit and the second pixel circuit are different in amplitude. For example, the power signal required by the first pixel circuit is smaller than the power signal required by the second pixel circuit, and the first sub-power signal line connected to the first pixel circuit and the second sub-power signal line connected to the second pixel circuit are configured to transmit different power signals.

For example, the plurality of second sub-power signal lines 922 include a second sub-power signal line 922 located on the same straight line as at least one first sub-power signal line 921, and a gap G is provided between the first sub-power signal line 921 and the second sub-power signal line 922 which are located on the same straight line. In the embodiments of the present disclosure, two signal lines located on the same straight line mean that the two signal lines can be penetrated by the same straight line.

For example, the first power signal can be transmitted from an integrated circuit located at a side of the first display region away from the second display region to the pixel circuit in the first display region through the first sub-power signal line. For example, the second sub-power signal line can be connected to the third sub-power signal line in the transition region through a structure in the second conductive layer, and the third sub-power signal line in the transition region is connected to another integrated circuit to provide the second power signal line for the second sub-power signal line.

Figure 14:
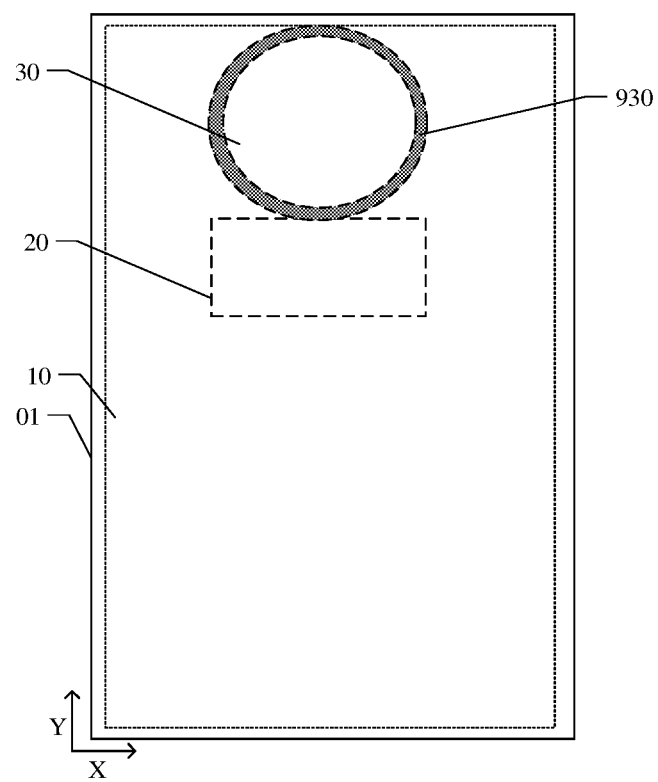
FIG. 14 is a planar structural view of a display substrate provided by an example of an embodiment of the present disclosure.
Figure 15:
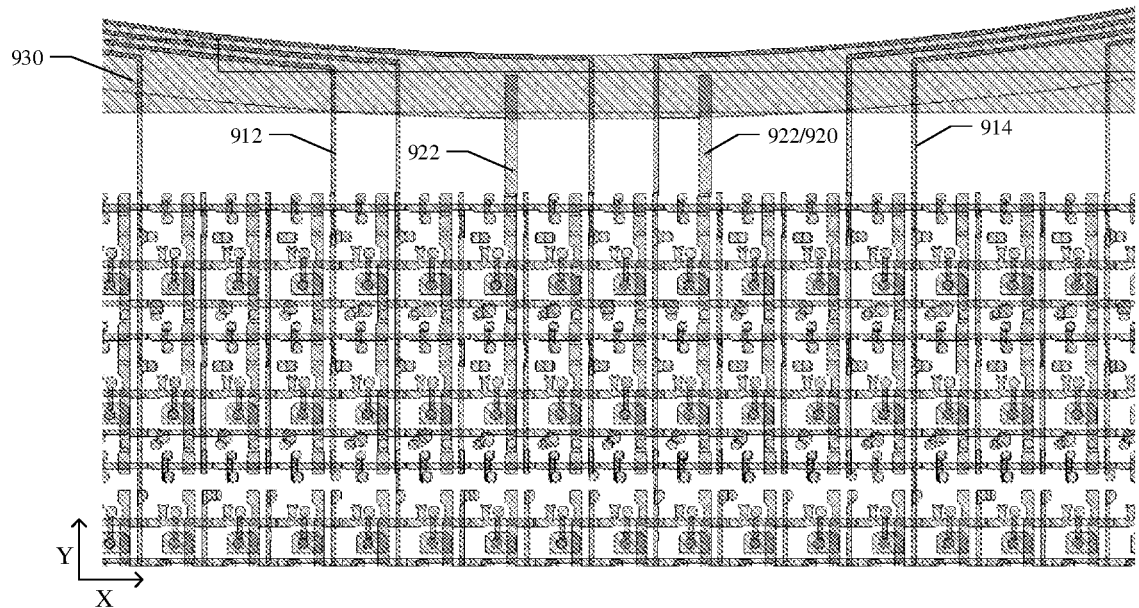
FIG. 15 is a partial structural view of the display substrate shown in FIG. 14.

For example, FIG. 14 is a planar structural view of a display substrate provided by an example of an embodiment of the present disclosure, and FIG. 15 is a partial structural view of the display substrate shown in FIG. 14. The present example is different from the examples shown in FIGS. 1-13 in that the present example further includes a light shielding layer.

For example, as shown in FIG. 14 and FIG. 15, the display substrate further includes a light shielding layer 930 located at the edge of the third display region 30. For example, as shown in FIG. 14 and FIG. 15, the light shielding layer 930 overlaps with the second sub-data line 912 and the fourth sub-data line 914 in the direction perpendicular to the base substrate 01, that is, the orthographic projection of the light shielding layer 930 on the base substrate 01 overlaps with the orthographic projections of the second sub-data line 912 and the fourth sub-data line 914 on the base substrate 01. In the embodiments of the present disclosure, the light shielding layer is arranged at the edge of the third display region, so that it can avoid diffraction of the data line located at the edge of the third display region and arranged in a winding mode.

For example, the shape of the light shielding layer 930 can be annular, but not limited thereto, and can be changed according to the shape of the third display region. For example, the outer ring of the light shielding layer 930 can be arc-shaped or broken to match the position of the light emitting unit group.

For example, the light shielding layer 930 is located on a side, away from the film layer where the power signal line 920 is located, of the film layer where the second sub-data line 912 is located (i.e., the film layer where the data line connecting portion is located). For example, the light shielding layer 930 can be located in the same layer as the first conductive layer shown in FIG. 9, which is convenient to manufacture and saves cost.

For example, at least one of the plurality of second sub-power signal lines 922 is connected to the light shielding layer 930, so as to reduce the resistance of the second sub-power signal line.

The features of each light emitting unit group and pixel circuit group in the first display region, the second display region and the third display region in the present example can be the same as the features of the corresponding structures in the examples shown in FIGS. 1-13, and details will not be repeated here.

Another embodiment of the present disclosure provides a display device, which includes the display substrate described above.

For example, the display device provided by the embodiment of the present disclosure can be a light emitting diode display device.

For example, in the display device provided by the embodiment of the present disclosure, the second display region is arranged between the third display region and the first display region, which is helpful to improve the phenomenon that the boundaries of the third display region and the first display region close to each other appears cyan or dark, and further improve the display image quality of the third display region (the region where the under-screen camera is located).

For example, the display device can further include a cover plate located on a display side of the display substrate. For example, the display device can further include a functional component located at a side of the base substrate away from the light emitting elements, and the functional component is opposite to the second display region.

For example, the functional component includes at least one of a camera module (e.g., a front camera module), a 3D structured light module (e.g., a 3D structured light sensor), a time-of-flight 3D imaging module (e.g., a time-of-flight sensor), an infrared sensing module (e.g., an infrared sensor), etc.

For example, the front camera module is usually activated when the user takes a selfie or makes a video call, and the pixel display region of the display device displays the image obtained by the selfie for the user to watch. The front camera module includes, for example, a lens, an image sensor, an image processing chip, etc. The optical image of the scene generated by the lens is projected on the surface of the image sensor (the image sensor includes two types, CCD and CMOS) and converted into electrical signals, the electrical signals are converted into digital image signals after analog-to-digital conversion by the image processing chip, and then the digital image signals are sent to a processor for processing, and the image of the scene is output on the display screen.

For example, the 3D structured light sensor and the time-of-flight (ToF) sensor can be configured for face recognition to unlock the display device.

For example, the functional component can include only a camera module to realize the function of selfie or video call; and for example, the functional component can further include a 3D structured light module or a time-of-flight 3D imaging module to realize face recognition unlocking, etc. The embodiment includes but is not limited to these cases.

For example, the display device can be any product or component with display function and an under-screen camera, such as a mobile phone, a tablet computer, a notebook computer, a navigator, etc., and the embodiments are not limited thereto.

The following statements should be noted:
(1) The accompanying drawings related to the embodiment(s) of the present disclosure involve only the structure(s) in connection with the embodiment(s) of the present disclosure, and other structure(s) can be referred to common design(s).
(2) In case of no conflict, features in one embodiment or in different embodiments of the present disclosure can be combined.

What have been described above are only specific implementations of the present disclosure, and the protection scope of the present disclosure is not limited thereto. Therefore, the protection scope of the present disclosure should be determined based on the protection scope of the claims.

What is claimed is:

1. A display substrate, comprising:
a first display region and a second display region,
wherein at least part of the first display region is located on a side of the second display region in a first direction, the first display region comprises a plurality of first light emitting unit groups and a plurality of first pixel circuit groups connected to the plurality of first light emitting unit groups, the second display region comprises a plurality of second light emitting unit groups and a plurality of second pixel circuit groups connected to the plurality of second light emitting unit groups, each light emitting unit group comprises a plurality of light emitting units of different colors;
wherein, in the first display region, one row of light emitting units arranged along a second direction intersected with the first direction comprise light emitting units of N different colors; and
wherein in the second display region, one row of light emitting units arranged along the second direction comprise light emitting units of M different colors, where N is greater than M, and both N and M are positive integers not less than 1; and
a third display region,
wherein the first display region is located on at least one side of the third display region, and at least part of the second display region is located between the first display region and the third display region, and
wherein the third display region comprises a plurality of third light emitting unit groups, and a plurality of third pixel circuit groups connected to the plurality of third light emitting unit groups are located at an outer side of the third display region.

2. The display substrate according to claim 1, wherein:
in the first display region, one row of light emitting units arranged along the second direction comprise light emitting units of three different colors; and
in the second display region, one row of light emitting units arranged along the second direction comprise light emitting units of one color or light emitting units of two different colors, and the light emitting units of the two different colors are alternately arranged along the second direction.

3. The display substrate according to claim 2, wherein:
in the first display region, one row of light emitting units arranged along the second direction comprise first color light emitting units, second color light emitting units and third color light emitting units which are repeatedly arranged in sequence; and
in the second display region, one row of light emitting units arranged along the second direction comprise one row of third color light emitting units, one row of second color light emitting units, or one row of first color light emitting units and second color light emitting units alternately arranged.

4. The display substrate according to claim 1, wherein the plurality of first pixel circuit groups comprise a plurality of first pixel circuits, the plurality of second pixel circuit groups comprise a plurality of second pixel circuits, a density of the plurality of first pixel circuits is a first density, a density of the plurality of second pixel circuits is a second density, and the first density is not less than the second density.

5. The display substrate according to claim 4, wherein:
a density of the plurality of first light emitting unit groups in the first display region is a third density, a density of the plurality of second light emitting unit groups in the second display region is a fourth density, and the third density is greater than the fourth density; and
a density of the plurality of third light emitting unit groups in the third display region is a fifth density, and both the third density and the fourth density are greater than the fifth density.

6. The display substrate according to claim 1, wherein:
each of the first light emitting unit groups, each of the second light emitting unit groups and each of the third light emitting unit groups comprises one first color light emitting unit, one second color light emitting unit pair and one third color light emitting unit; and
the first light emitting unit and the third color light emitting unit are located in different rows, and at least one second color light emitting unit of the second color light emitting unit pair and the first color light emitting unit are arranged along the second direction.

7. The display substrate according to claim 6, wherein:
in at least one of the second light emitting unit groups adjacent to one first light emitting unit group, a distance between two light emitting regions of the second color light emitting unit pair in the first direction is a first distance;
a distance between a light emitting region of one second color light emitting unit, which is located in the second color light emitting unit pair of the at least one of the second light emitting unit groups and close to the one first light emitting unit group, and a light emitting region, adjacent to the light emitting region of the one second color light emitting unit, of the second color light emitting unit located in the one first light emitting unit group in the first direction is a second distance; and
the first distance is greater than the second distance.

8. The display substrate according to claim 7, wherein the first distance is greater than a size of a light emitting region of the third color light emitting unit in the second light emitting unit group in the first direction.

9. The display substrate according to claim 7, wherein, in the at least one of the second light emitting unit groups, one second color light emitting unit of the second color light emitting unit pair is located in the same row as the first color light emitting unit, and the other second color light emitting unit of the second color light emitting unit pair is located in the same row as the first color light emitting unit in the first light emitting unit group.

10. The display substrate according to claim 6, wherein:
a ratio of an area of a light emitting region of each first color light emitting unit in the third light emitting unit group to an area of a light emitting region of each first color light emitting unit in the first light emitting unit group is in a range of 1.1-2.5;
a ratio of an area of light emitting regions of each second color light emitting unit pair in the third light emitting unit group to an area of light emitting regions of each second color light emitting unit pair in the first light emitting unit group is in a range of 1.1-2.5; and
a ratio of an area of a light emitting region of each third color light emitting unit in the third light emitting unit group to an area of a light emitting region of each third color light emitting unit in the first light emitting unit group is in a range of 1.1-2.5.

11. The display substrate according to claim 10,
wherein the plurality of second light emitting unit groups comprise first sub-light emitting unit groups and second sub-light emitting unit groups alternately arranged along the second direction, and at least one third light emitting unit group adjacent to the plurality of second light emitting unit groups is located in the same column as the second sub-light emitting unit groups, and
wherein:
in at least one of the plurality of first light emitting unit groups, a distance between the light emitting region of the first color light emitting unit and the light emitting region of the second color light emitting unit adjacent to each other is a third distance;
in at least one of the first sub-light emitting unit groups, a distance between the light emitting region of the first color light emitting unit and the light emitting region of the second color light emitting unit adjacent to each other is a fourth distance; and
in at least one of the second sub-light emitting unit groups, a distance between the light emitting region of the first color light emitting unit and the light emitting region of the second color light emitting unit adjacent to each other is a fifth distance, the fifth distance is greater than the fourth distance, and the fourth distance is greater than the third distance.

12. The display substrate according to claim 11, wherein:
in at least one of the first sub-light emitting unit groups, a distance between two center lines, extending in the first direction, of two light emitting regions of the second color light emitting unit pair is a sixth distance; and
in at least one of the second sub-light emitting unit groups, a distance between two center lines, extending in the first direction, of two light emitting regions of the second color light emitting unit pair is a seventh distance, and the seventh distance is greater than the sixth distance.

13. The display substrate according to claim 11, wherein:
in at least one of the first sub-light emitting unit groups, a distance between a center line extending in the first direction of the light emitting region of the first color light emitting unit and a center line extending in the first direction of the light emitting region of the second color light emitting unit located in a different row from the first color light emitting unit is an eighth distance; and
in at least one of the second sub-light emitting unit groups, a distance between a center line extending in the first direction of the light emitting region of the first color light emitting unit and a center line extending in the first direction of the light emitting region of the second color light emitting unit located in a different row from the first color light emitting unit is a ninth distance, and a ratio of the ninth distance to the eighth distance is in a range of 0.8-1.2.

14. The display substrate according to claim 6, wherein:
in at least one of the plurality of first light emitting unit groups and at least one of the plurality of second light emitting unit groups, light emitting regions of the first color light emitting units have approximately the same shape and the same area; and
in the first light emitting unit group and the second light emitting unit group, light emitting regions of the third color light emitting units have approximately the same shape and the same area.

15. The display substrate according to claim 14, wherein, in at least one of the plurality of first light emitting unit groups, shapes of light emitting regions of the first color light emitting unit and the third color light emitting unit comprise hexagons, and a shape of a light emitting region of each second color light emitting unit in the second color light emitting unit pair comprises a pentagon.

16. The display substrate according to claim 15, wherein:
in at least one of the plurality of first light emitting unit groups and at least one of the plurality of third light emitting unit groups, shapes of light emitting regions of light emitting units emitting light of a same color are different; and
in at least one of the plurality of third light emitting unit groups, a shape of a light emitting region of at least one light emitting unit comprises a circle, an ellipse or a droplet-shape.

17. The display substrate according to claim 6, wherein a ratio of an area of a light emitting region of each first color light emitting unit in the third light emitting unit group to an area of a light emitting region of each first color light emitting unit in the first light emitting unit group is in a range of 0.5-1, a ratio of an area of light emitting regions of each second color light emitting unit pair in the third light emitting unit group to an area of light emitting regions of each second color light emitting unit pair in the first light emitting unit group is in a range of 0.5-1, and a ratio of an area of a light emitting region of each third color light emitting unit in the third light emitting unit group to an area of a light emitting region of each third color light emitting unit in the first light emitting unit group is in a range of 0.5-1.

18. The display substrate according to claim 17, wherein:
in at least one of the plurality of second light emitting unit groups and at least one of the plurality of third light emitting unit groups, light emitting regions of light emitting units emitting light of a same color have approximately the same shape and the same area; and
in at least one of the plurality of first light emitting unit groups and at least one of the plurality of third light emitting unit groups, shapes of light emitting regions of light emitting units emitting light of a same color are different.

19. A display device, comprising the display substrate according to claim 1.

20. A display substrate, comprising:
a first display region and a second display region,
wherein at least part of the first display region is located on a side of the second display region in a first direction, the first display region comprises a plurality of first light emitting unit groups and a plurality of first pixel circuit groups connected to the plurality of first light emitting unit groups, the second display region comprises a plurality of second light emitting unit groups and a plurality of second pixel circuit groups connected to the plurality of second light emitting unit groups, each light emitting unit group comprises a plurality of light emitting units of different colors,
wherein:
in the first display region, one row of light emitting units arranged along a second direction intersected with the first direction comprise light emitting units of N different colors; and
in the second display region, one row of light emitting units arranged along the second direction comprise light emitting units of M different colors, where N is greater than M, and both N and M are positive integers not less than 1, and
wherein:
in the first display region, one row of light emitting units arranged along the second direction comprise first color light emitting units, second color light emitting units and third color light emitting units which are repeatedly arranged in sequence; and
in the second display region, one row of light emitting units arranged along the second direction comprise one row of third color light emitting units, one row of second color light emitting units, or one row of first color light emitting units and second color light emitting units alternately arranged.

* * * * *